United States Patent
Ebrahimi Takalloo et al.

(10) Patent No.: US 10,229,564 B2
(45) Date of Patent: Mar. 12, 2019

(54) APPARATUS AND METHODS FOR PROVIDING TACTILE STIMULUS INCORPORATING TRI-LAYER ACTUATORS

(71) Applicant: The University of British Columbia, Vancouver (CA)

(72) Inventors: Saeedeh Ebrahimi Takalloo, Vancouver (CA); John D. W. Madden, Vancouver (CA); Shahriar Mirabbasi, Vancouver (CA); Meisam Farajollahi, Vancouver (CA)

(73) Assignee: The University of British Columbia, Vancouver (CA)

( * ) Notice: Subject to any disclaimer, the term of this patent is extended or adjusted under 35 U.S.C. 154(b) by 0 days.

(21) Appl. No.: 15/692,298

(22) Filed: Aug. 31, 2017

(65) Prior Publication Data
US 2018/0053386 A1   Feb. 22, 2018

Related U.S. Application Data

(63) Continuation of application No. PCT/CA2016/050258, filed on Mar. 9, 2016.
(Continued)

(51) Int. Cl.
*G08B 6/00* (2006.01)
*F03G 7/00* (2006.01)
(Continued)

(52) U.S. Cl.
CPC ............... *G08B 6/00* (2013.01); *F03G 7/005* (2013.01); *H01L 41/094* (2013.01); *H01L 41/0973* (2013.01); *H01L 41/193* (2013.01)

(58) Field of Classification Search
CPC ..... G08B 6/00; H01L 41/0973; H01L 41/193; H01L 41/094; F03G 7/005
See application file for complete search history.

(56) References Cited

U.S. PATENT DOCUMENTS 5,222,895 A   6/1993   Fricke
5,496,174 A   3/1996   Garner
(Continued)

FOREIGN PATENT DOCUMENTS

CN   102067068   5/2011
CN   102422244   4/2012

OTHER PUBLICATIONS

Nnamdi Felix Nworah, Department of Biomedical Engineering. Master's Thesis—Fabrication and characterization of individually addressable Polypyrole Trilayer Microactuators, NWORAH, Dec. 31, 2012.
(Continued)

*Primary Examiner* — Erin F Heard
(74) *Attorney, Agent, or Firm* — Oyen Wiggs Green & Mutala LLP

(57) ABSTRACT

An apparatus provides tactile stimulus to a human user using a tri-layer actuator comprising: first and second polymer layers which are electronically and ionically conductive and have one or more dimensions which vary in dependence on insertion of ions therein and withdrawal of ions therefrom; and a deformable layer located between the first and second polymer layers to physically separate the first and second polymer layers from one another, the deformable layer electronically insulating and ionically conductive. Application of first and second voltages between the first and second polymer layers creates corresponding first and second distributions of ions within the first and second polymer layers. Changing between application of the first and second voltages causes corresponding deformation of the tri-layer actuator between corresponding first and second shapes, a difference or transition between the first and second shapes detectable by a sense of touch of a human user.

48 Claims, 13 Drawing Sheets

Related U.S. Application Data

(60) Provisional application No. 62/130,595, filed on Mar. 9, 2015.

(51) Int. Cl.
*H01L 41/09* (2006.01)
*H01L 41/193* (2006.01)

(56) References Cited

U.S. PATENT DOCUMENTS

| | | | |
|---|---|---|---|
| 5,766,013 | A | 6/1998 | Vuyk |
| 7,196,688 | B2 | 3/2007 | Schena |
| 7,589,714 | B2 | 9/2009 | Funaki |
| 8,174,372 | B2 | 5/2012 | da Costa |
| 8,486,352 | B2 * | 7/2013 | Yang .................. F16K 99/0001 422/50 |
| 2005/0043657 | A1 | 2/2005 | Couvillon, Jr. |
| 2006/0022558 | A1 * | 2/2006 | Bindig ................ H01L 41/0472 310/366 |
| 2006/0102455 | A1 * | 5/2006 | Chiang ................... F03G 7/005 200/181 |
| 2009/0115734 | A1 | 5/2009 | Fredriksson et al. |
| 2010/0097323 | A1 | 4/2010 | Edwards et al. |
| 2010/0109486 | A1 | 5/2010 | Polyakov et al. |
| 2010/0244636 | A1 * | 9/2010 | Denneler ............ H01L 41/0472 310/366 |
| 2010/0283731 | A1 | 11/2010 | Grant et al. |
| 2012/0032559 | A1 * | 2/2012 | Hino ..................... H01L 41/047 310/331 |
| 2013/0181572 | A1 * | 7/2013 | Hino ....................... H01L 41/08 310/311 |
| 2013/0207793 | A1 | 8/2013 | Weaber et al. |
| 2014/0245996 | A1 * | 9/2014 | Nakamura ............ H01L 41/083 123/456 |

OTHER PUBLICATIONS

S. J. Biggs, R. N. Hitchcock, and N. M. Ave, "Artificial muscle actuators for haptic displays☐: system design to match the dynamics and tactile sensitivity of the human fingerpad," in SPIE Smart Structures and Materials+ Nondestructive Evaluation and Health Monitoring, 2010, p. 76420I-76420I.
Y. Bar-cohen, "Electroactive polymers for refreshable Braille displays," SPIE Newsroom, pp. 5-7, 2009.
H. R. Choi, S. W. Lee, K. M. Jung, J. C. Koo, S. I. Lee, H. G. Choi, J. W. Jeon, and J. D. Nam, "Tactile Display as a braille display for Visually Disabled," in IEEEIRSJ International Conference on Inleltlgent Robots and Systems, 2004, pp. 1985-1990.
P. Chakraborti, H. a. K. Toprakci, P. Yang, N. Di Spigna, P. Franzon, and T. Ghosh, "A compact dielectric elastomer tubular actuator for refreshable Braille displays," Sensors Actuators A Phys., vol. 179, pp. 151-157, Jun. 2012.
S. Lee, K. Jung, J. Koo, S. Lee, H. Choi, J. Jeon, J. Nam, and H. Choi, "Braille Display Device Using Soft Actuator," in SPIE Smart Structures and Materials, 2004, vol. 5385, pp. 368-379.
M. Matysek, P. Lotz, T. Winterstein, and H. F. Schlaak, "Dielectric elastomer actuators for tactile displays," in EuroHaptics conference, 2009 and Symposium on Haptic Interfaces for Virtual Environment and Teleoperator Systems. World Haptics 2009. Third Joint, 2009, pp. 290-295.
I. M. Koo K. Jung, J. C. Koo, J. Nam, and Y. K. Lee, "Development of Soft-Actuator-Based Wearable Tactile Display," IEEE Trans. Robot., vol. 24, No. 3, pp. 549-558, Jun. 2008.
G. J. Monkman, "An electrorheological tactile display," Presence Teleoperators Virtual Environ., vol. 1, No. 2, pp. 219-228, May 1992.
R. M. Voyles, G. Fedder, and P. K. Wlosla, "Design of a Modular Tactile Sensor and Actuator Based on an Electrorheological Gel," in Robotics and Automation, 1996. Proceedings., 1996 IEEE International Conference on, 1996, No. April, pp. 13-17.
P. M. Taylor, D. M. Pollet, A. Hosseini-Sianaki, and C. J. Valley, "Advances in an electrorheological fluid based tactile array," Displays, vol. 18, No. 3, pp. 135-141, May 1998.
G. Paschew and A. Richter, "High-resolution tactile display operated by an integrated Smart Hydrogel actuator array," in SPIE Smart Structures and Materials+ Nondestructive Evaluation and Health Monitoring, 2010, p. 764234.
K. Fukuda, T. Sekitani, U. Zschieschang, H. Klauk, K. Kuribara, T. Yokota, T. Sugino, K. Asaka, M. Ikeda, H. Kuwabara, T. Yamamoto, K. Takimiya, T. Fukushima, T. Aida, M. Takamiya, T. Sakurai, and T. Someya, "A 4 V operation, flexible braille display using organic transistors, carbon nanotube actuators, and organic static random-access memory," Adv. Funct. Mater., vol. 21, pp. 4019-4027, 2011.
Y. Kato, S. Member, T. Sekitani, M. Takamiya, M. Doi, K. Asaka, T. Sakurai, and T. Someya, "Sheet-Type Braille Displays by Integrating Organic Field-Effect Transistors and Polymeric Actuators," IEEE Trans. Electron Devices, vol. 54, No. 2, pp. 202-209, 2007.
M. Konyo, S. Tadokoro, a. Yoshida, and N. Saiwaki, "A tactile synthesis method using multiple frequency vibrations for representing virtual touch," 2005 IEEE/RSJ Int. Conf. Intell. Robot. Syst., pp. 3965-3971, 2005.
J. D. W. Madden, N. a. Vandesteeg, P. a. Anquetil, P. G. a. Madden, a. Takshi, R. Z. Pytel, S. R. Lafontaine, P. a. Wieringa, and I. W. Hunter, "Artificial Muscle Technology: Physical Principles and Naval Prospects," IEEE J. Ocean. Eng., vol. 29, No. 3, pp. 706-728, Jul. 2004.
G. M. Spinks, G. G. Wallace, J. Ding, D. Zhou, B. Xi, and J. Gillespie, "Ionic liquids and polypyrrole helix tubes: bringing the electronic Braille screen closer to reality," in Smart Structures and Materials, 2003, pp. 372-380.
A. Maziz, C. Plesse, C. Soyer, C. Chevrot, D. Teyssié, E. Caftan, and F. Vidal, "Demonstrating kHz Frequency Actuation for Conducting Polymer Microactuators," Adv. Funct. Mater., May 2014.
L. Skedung, M. Arvidsson, J. Y. Chung, C. M. Stafford, B. Berglund, and M. W. Rutland, "Feeling Small: Exploring the tactile perception limits," Sci. Rep., vol. 3, 2013.
J. G. Tait, B. J. Worfolk, S. A. Maloney, T. C. Hauger, A. L. Elias, J. M. Buriak, and K. D. Harris, "Spray coated high-conductivity PEDOT:PSS transparent electrodes for stretchable and mechanically-robust organic solar cells," Sol. Energy Mater. Sol. Cells, vol. 110, pp. 98-106, Mar. 2013.
D. G. Caldwell, N. Tsagarakis, and C. Giesler, "An Integrated TactileBhear Feedback Array for Stimulation of Finger Mechanoreceptor," in IEEE international conference on Robotics and Automation, 1999, vol. 1, pp. 287-292.
J. Pasquero and V. Hayward, "STReSS: A practical tactile display system with one millimeter spatial resolution and 700 Hz refresh rate," in Proc. Eurohaptics, 2003, vol. 2003, pp. 94-110.
J. Pasquero, J. Luk, V. Lévesque, Q. Wang, V. Hayward, and K. E. MacLean, "Haptically Enabled Handheld Information Display with Distributed Tactile Transducer," Multimedia, IEEE Trans., vol. 9, No. 4, pp. 746-753, 2007.
N. Asamura, T. Shinohara, Y. Tojo, and H. Shinoda, "Necessary spatial resolution for realistic tactile feeling display," in ICRA, 2001, pp. 1851-1856.
Brisben, A.J., S.S. Hsiao, and K.O. Johnson, "Detection of vibration transmitted through an object grasped in the hand" Journal of Neurophysiology 81.4 (1999): 1548-1558.
Nicolas Festin, Ali Maziz, Cedric Plesse, Dominique Teyssei, Claude Chevrot, and Frederic Vidal, "Robust solid polymer electrolyte for conducting IPN actuators" Smart Materials and Structures 22:10 (2013).
Vidal, et al., "Long-Life Air Working Semi-IPN/Ionic Liquid:New Precursor of Artificial Muscles"; Mol. Cryst. Liq. Cryst., vol. 448, pp. 95=[697]-102=[704], 2006.
Vidal, et al., "Conducting IPN actuators: From polymer chemistry to actuator with linear actuation"; Synthetic Metals 156 (2006) 1299-1304.

* cited by examiner

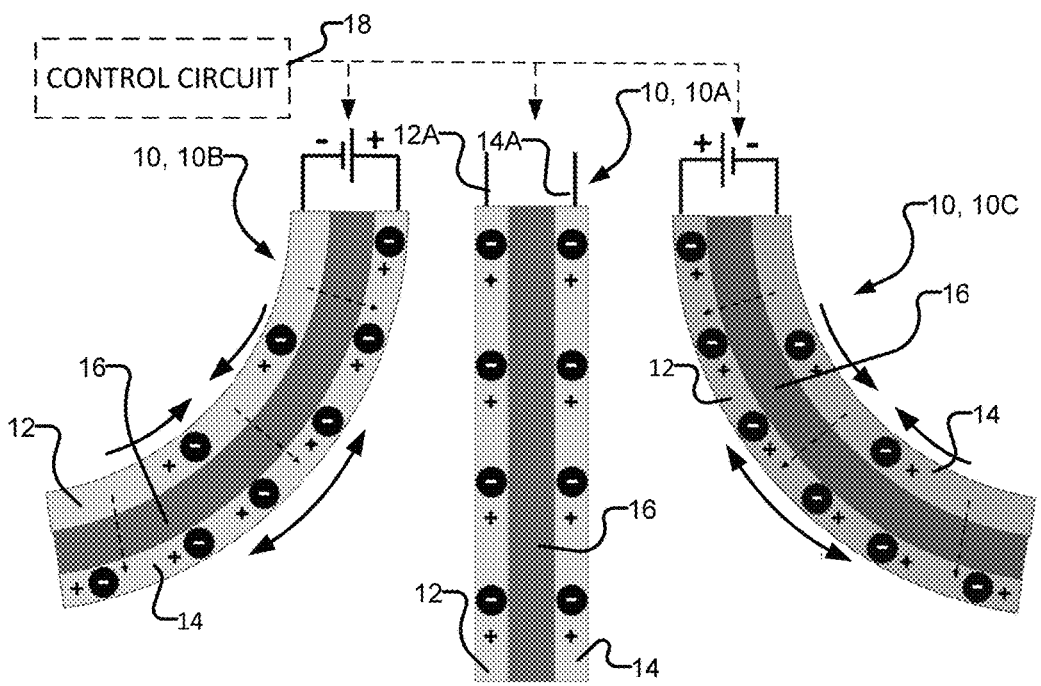
FIGURE 1B  FIGURE 1A  FIGURE 1C
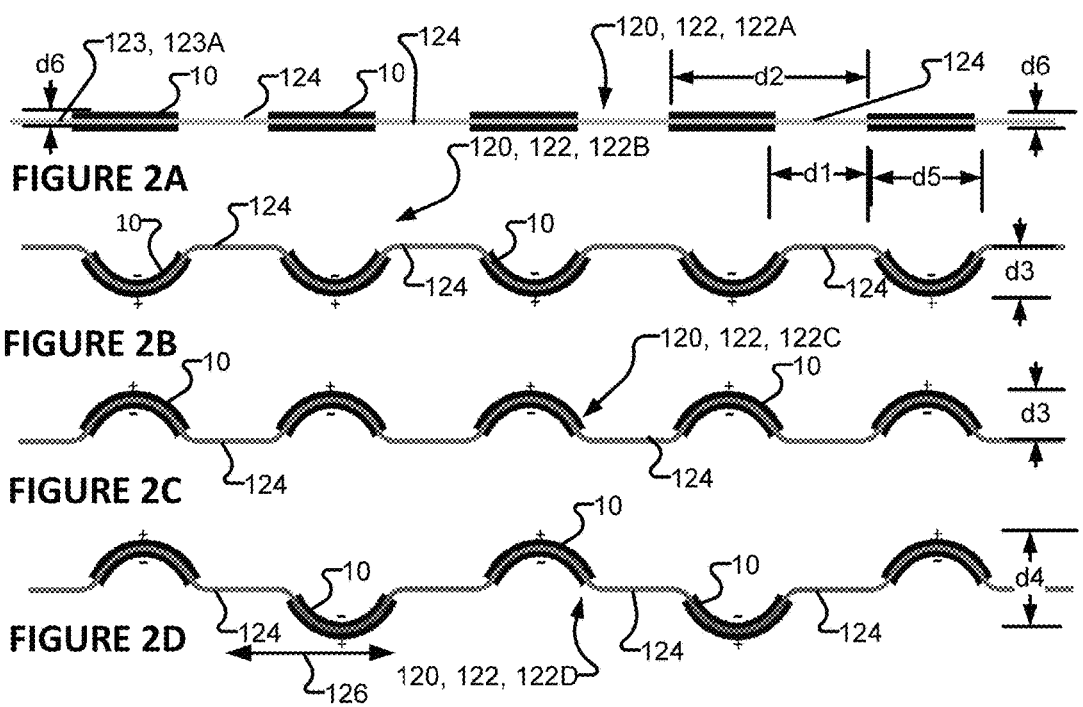
FIGURE 2A
FIGURE 2B
FIGURE 2C
FIGURE 2D

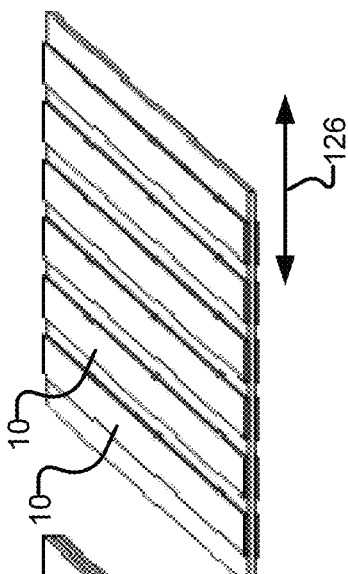
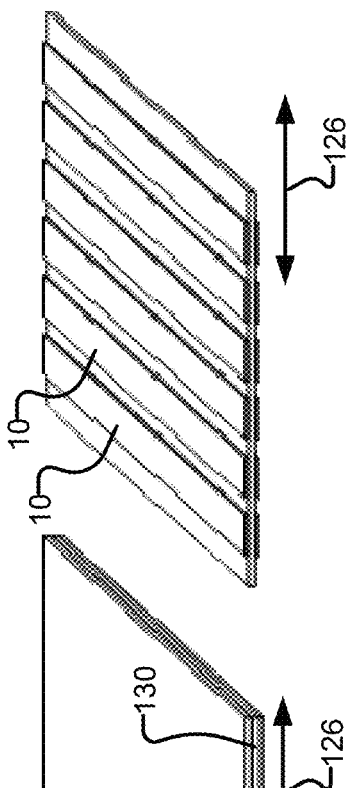
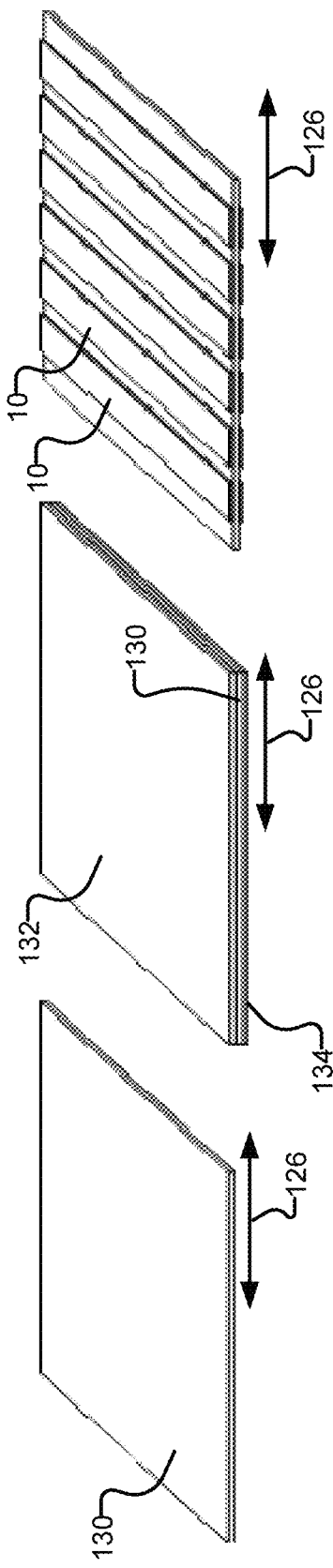
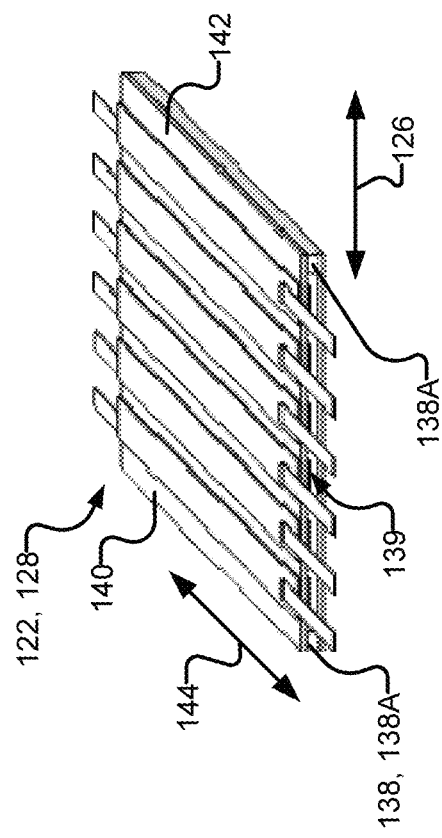
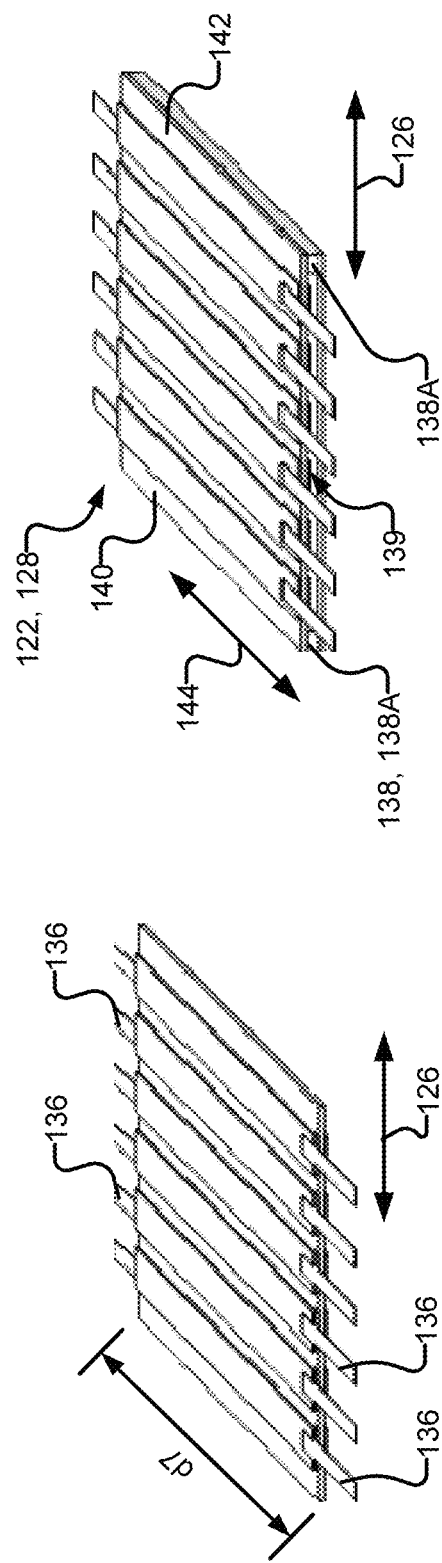

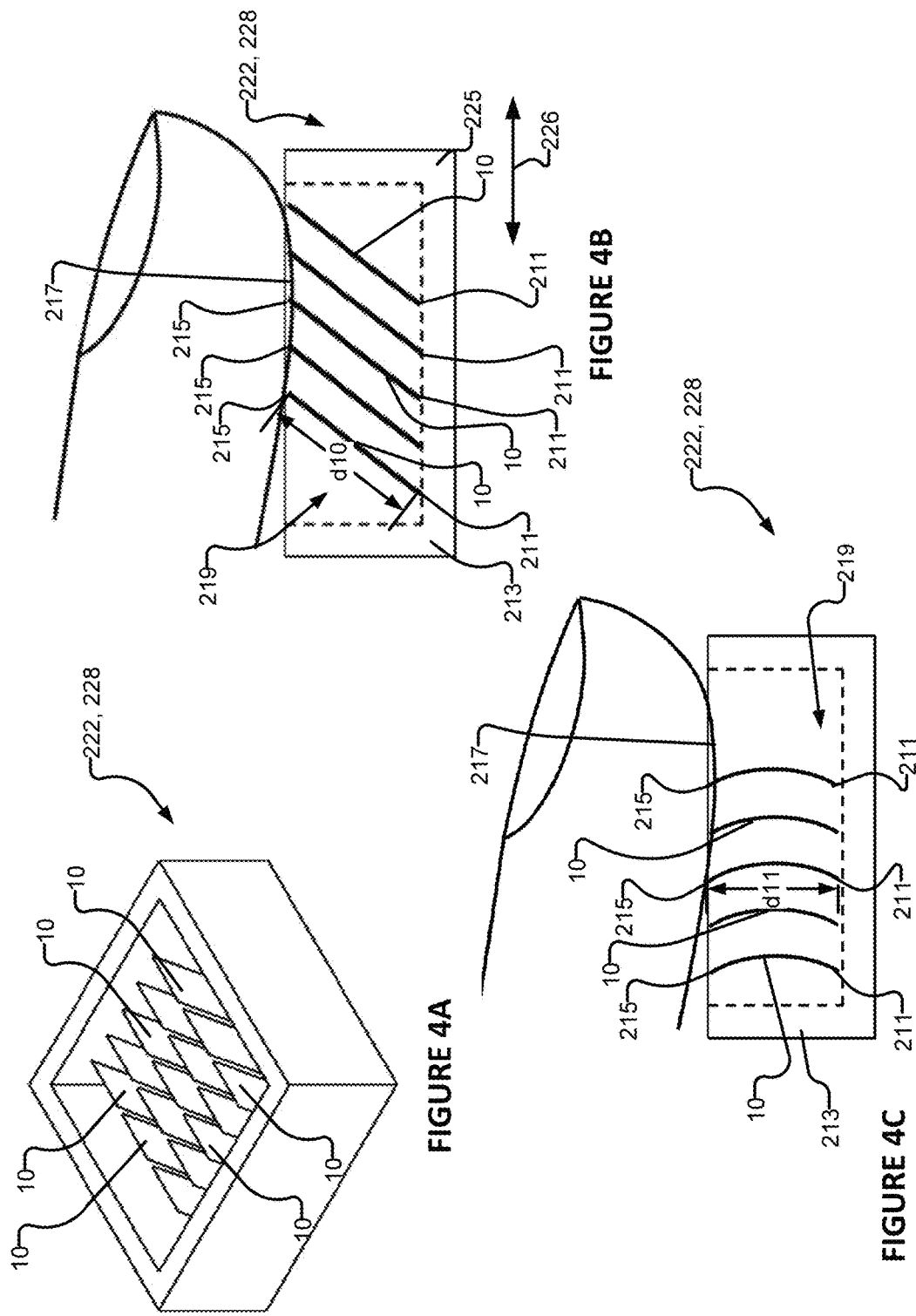

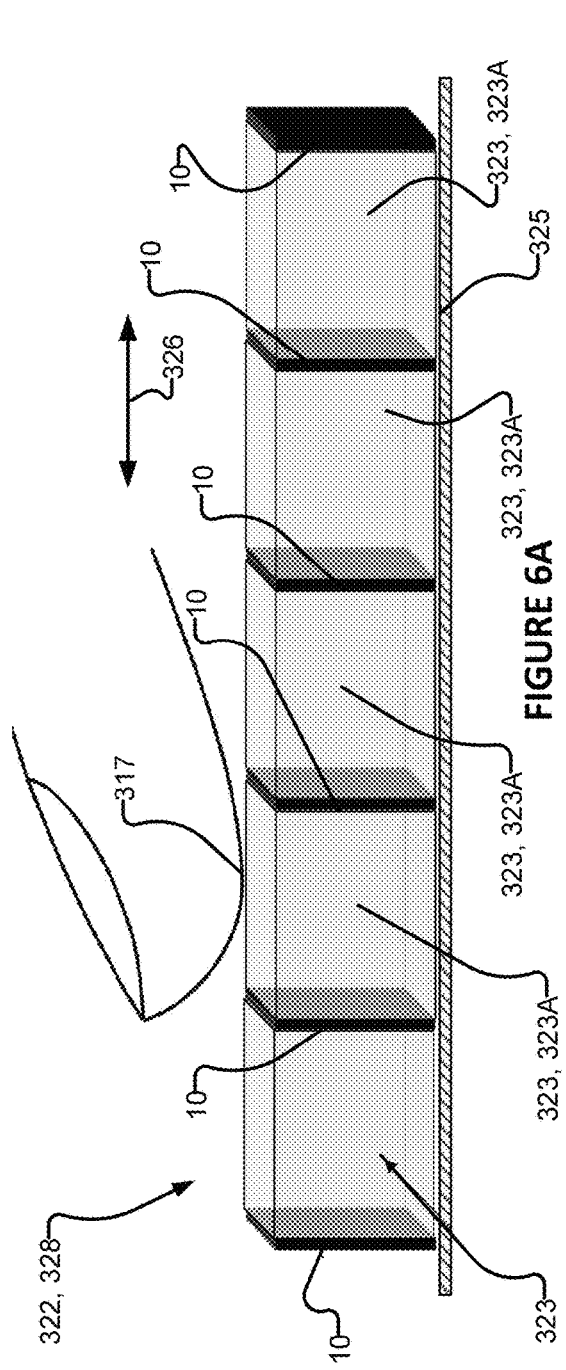
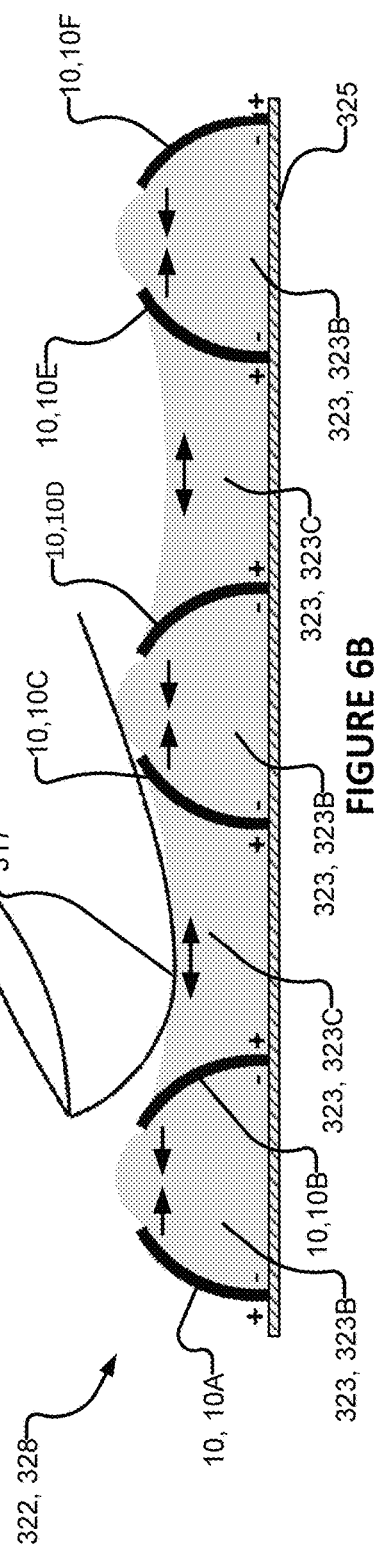

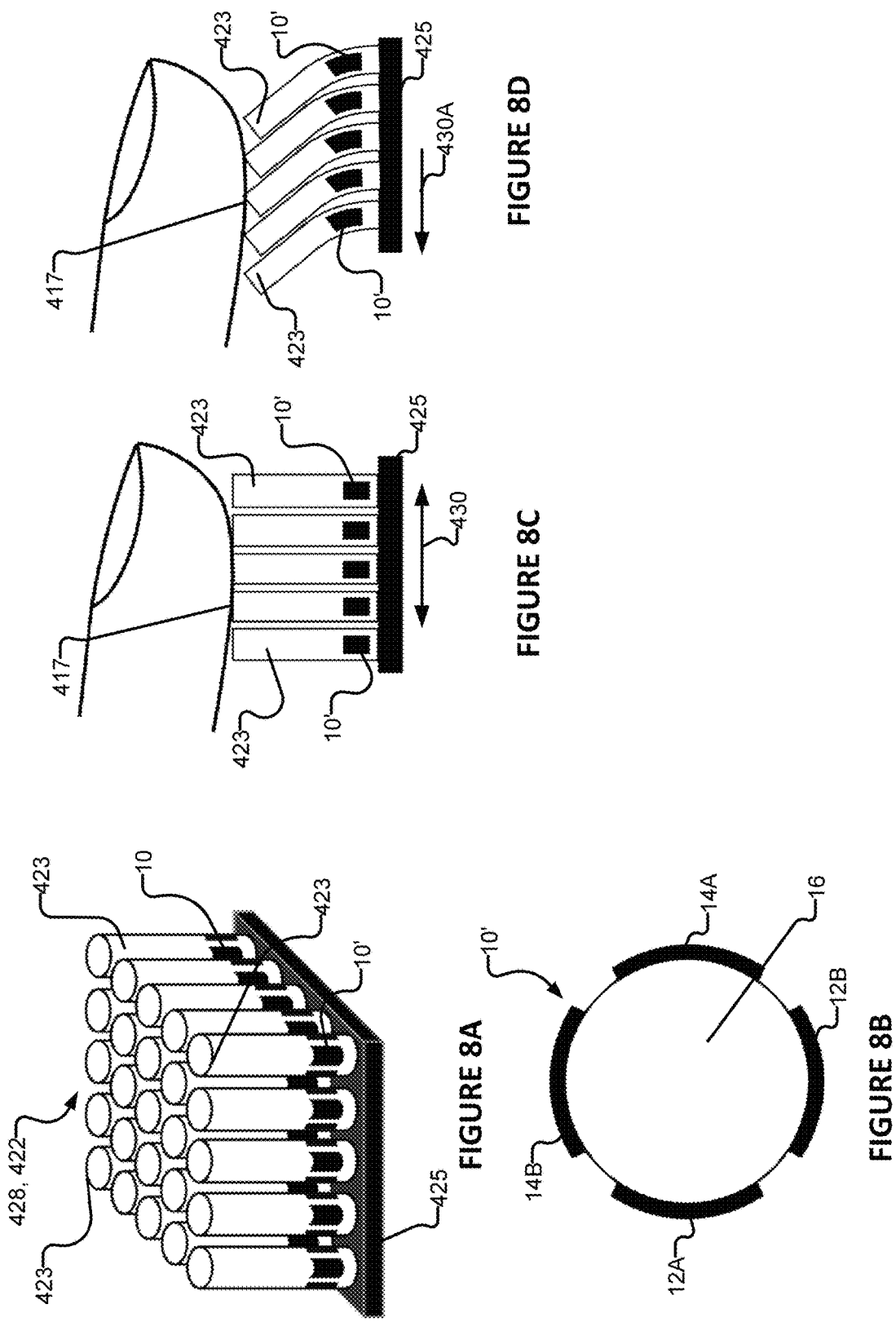

APPARATUS AND METHODS FOR PROVIDING TACTILE STIMULUS INCORPORATING TRI-LAYER ACTUATORS

This application is a continuation of Patent Cooperation Treaty application No. PCT/CA2016/050258 which has an international filing date of 9 Mar. 2016. Patent Cooperation Treaty application No. PCT/CA2016/050258 claims priority from, and the benefit of 35 USC 119(e) in connection with, U.S. application No. 62/130,595 filed 9 Mar. 2015. All of the applications in this paragraph are hereby incorporated herein by reference.

TECHNICAL FIELD

The invention relates to apparatus and methods for providing tactile stimulus using tri-layer actuators.

BACKGROUND

Within the fields of haptics, there is a general desire to provide tactile stimulus and/or tactile feedback at particular locations and/or at particular regions and/or on so-called tactile displays. Tactile displays have functionality which is distinct from visual or graphic displays, although there is a desire to implement tactile displays and graphic displays on the same devices. Such tactile stimulus may involve one or more of a variety of different types of stimulus and corresponding different sensations, such as, by way of non-limiting example, vibration, changes in pressure, changes in force and/or changes in texture (e.g. roughness, compliance, friction). Methods and apparatus providing tactile stimulus may have a wide variety of applications, including (without limitation): Minimally Invasive Surgery (MIS), sensory substitution, 3D surface generation, games, interactive keyboards, touchpads and/or the like.

Recently, electroactive materials (EAP) have been proposed as potential materials which could be used to implement vibration generators for headphones and smart phone cases and to provide braille cell displays. However, EAP-based devices have drawbacks in that they require: high driving voltage (typically greater than 5 kV) which requires correspondingly complex and expensive driving electronics and proper isolation; and high compliance (typically less than 1 MPa elastic modulus) which makes their vibratory effect difficult to sense. Electro/magnetorheological materials have also been proposed for braille cell displays and texture displays. Tactile stimulus devices using electro/magnetorheological materials require similarly high driving voltages for actuation.

There is a general desire for apparatus and methods for providing human-detectable tactile stimulus and/or feedback. There may be a desire to overcome or ameliorate some of the aforementioned issues or other issues with the prior art.

The foregoing examples of the related art and limitations related thereto are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIGS. 1A, 1B and 1C (collectively, FIG. 1) respectively schematically depict cross-sectional views of an exemplary tri-layer actuator with no applied voltage (FIG. 1A), with an applied voltage of a particular polarity (FIG. 1B) and an applied voltage of an opposing polarity (FIG. 1C).

FIGS. 2A-2D (collectively, FIG. 2) respectively schematically depict cross-sectional views of an apparatus for providing tactile stimulus to a human user according to particular embodiments.

FIGS. 3A-3E (collectively, FIG. 3) schematically depict a method for fabricating the FIG. 2 apparatus according to an exemplary non-limiting embodiment.

FIGS. 4A-4C (collectively, FIG. 4) depict perspective (FIG. 4A) and cross-sectional (FIGS. 4B and 4C) views of a portion (e.g. a cell) of an apparatus which may be used to provide human-detectable tactile stimulus according to another particular embodiment.

FIGS. 6A and 6B (collectively, FIG. 6) depict cross-sectional views of a portion (e.g. a cell) of an apparatus which may be used to provide human-detectable tactile stimulus according to another particular embodiment.

FIGS. 8A-8D (collectively, FIG. 8) depict a variety of views of a portion (e.g. a cell) of an apparatus which may be used to provide human-detectable tactile stimulus according to another particular embodiment.

DESCRIPTION

Figure 5C:
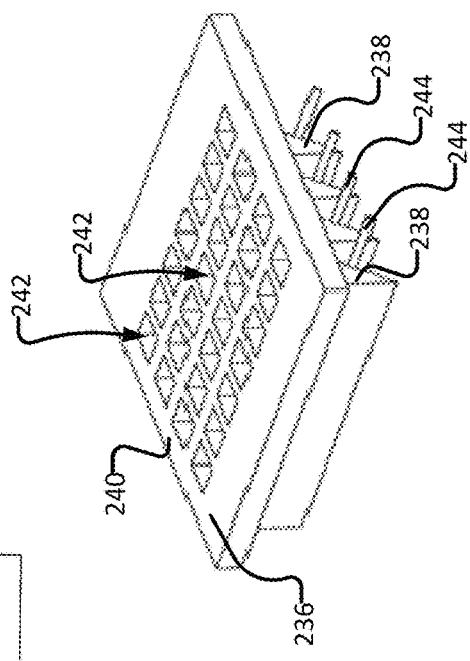
FIGS. 5A-5C (collectively, FIG. 5) schematically depict a method for fabricating the FIG. 4 apparatus according to an exemplary non-limiting embodiment.

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

Aspects of the invention provide apparatus and methods for providing tactile stimulus using tri-layer actuators. Tri-layer actuators according to some embodiments comprise: first and second conductive layers which are electronically and ionically conductive and which have shapes and/or dimensions that vary in dependence on insertion of ions therein and withdrawal of ions therefrom; and a deformable layer which is electronically insulating and ionically conductive and which is located between and in contact with the first and second conductive layers to physically separate the first and second conductive layers from one another. In currently preferred embodiments, the first and second conductive layers of the tri-layer actuators comprise first and second polymer layers—i.e. conducting polymer layers. This is not necessary, however, and, in some embodiments, tri-layer actuators may comprise so-called Ionic Polymer Metal Composite (IPMC) actuators, where the first and second conductive layers comprise metal layers. or other forms of tri-layer actuators. Application of first and second voltages between the first and second conductive (e.g. conductive polymer) layers of a tri-layer actuator creates corresponding first and second distributions of ions within the first and second conductive (e.g. conductive polymer) layers and causes corresponding deformation of the tri-layer actuator between corresponding first and second shapes. The difference between the first and second shapes may be detectable (as tactile stimulus) to a human user.

FIGS. 1A, 1B and 1C (collectively, FIG. 1) respectively schematically depict cross-sectional views of an exemplary tri-layer actuator 10 with no applied voltage or an applied voltage of zero (FIG. 1A), with an applied voltage of a particular polarity (FIG. 1B) and an applied voltage of an opposing polarity (FIG. 1C). Tri-layer actuator 10 may have substantially uniform cross-section in the dimension into and out of the page in the FIG. 1 view. Tri-layer actuator 10 comprises first and second conductive layers 12, 14 which are electronically and ionically conductive. The shapes and/or dimensions of first and second conductive layers 12, 14 vary with (e.g. in dependence on) insertion of ions therein and withdrawal of ions therefrom. In the case of the FIG. 1 embodiment, the shapes and/or dimensions of first and second conductive layers 12, 14 increase in size with the insertion of ions (e.g. an increase in ion density in conductive layers 12, 14 causes a corresponding increase in the size of conductive layers 12, 14) and decrease in size with the withdrawal of ions (e.g. a decrease in ion density in conductive layers 12, 14 causes a corresponding decrease in the size of conductive layers 12, 14). Tri-layer actuator 10 also comprises a deformable layer 16 which is located between and in contact with first and second conductive layers 12, 14. Deformable layer 16 physically separates first and second conductive layers 12, 14 from one another.

Deformable layer 16 is ionically conducting and electronically insulating. This contrasts with conductive layers 12, 14, which conduct both electrons and ions. In some embodiments, the insulating characteristic of deformable layer 16 to electronic transport, gives rise to an electronic conductivity, $\sigma_e$, of deformable layer 16 (i.e. the conductivity of deformable layer 16 to the flow of electrons) which is $\sigma_e \leq 10^{-10}$ S/m (Seimens/meter), although this range is not necessary. In some embodiments, the ionic conductivity, $\sigma_i$, of deformable layer 16 (i.e. the conductivity of deformable layer 16 to the flow of ions) is in a range of $10^{-3}$ S/m<$\sigma_i$<10 S/m, although this range is not necessary. In general, the electronic conductivity of deformable layer 16 is lower (and preferably significantly lower) than the ionic conductivity of deformable layer 16. In some embodiments, the ionic conductivity of deformable layer 16 is greater than 1000 times the electronic conductivity of deformable layer 16. In some embodiments, this ratio is greater than $10^6$. In some embodiments, this ratio is greater than $10^8$. In some embodiments, the electronic and ionic conductivities, $\sigma_e$ and $\sigma_i$, of conductive layers 12, 14 are in a range of $10^2$ S/m<$\sigma_e$<$10^7$ S/m and $10^{-5}$ S/m<$\sigma_i$<0.1 S/m respectively, although these ranges are not necessary.

In currently preferred embodiments, tri-layer actuator 10 comprises conductive layers 12, 14 fabricated from (or otherwise made up primarily of) conducting polymer(s). Conducting polymers are well known and may comprise suitably doped polymeric materials. By way of non-limiting example, suitable conducting polymers usable for conductive layers 12, 14 include: polypyrrole (Ppy), polyaniline (PANI), Polythiophene (PTs), Poly(3,4-ethylenedioxythiophene)(PEDOT), and/or the like. In some embodiments, the conducting polymers used in conductive layers 12, 14 comprise positive charge carriers and charge-balancing ions. In some embodiments, tri-layer actuator 10 comprises conductive layers 12, 14 fabricated from (or otherwise made up primarily of) metal(s). By way of non-limiting example, in some embodiments, conductive layers 12, 14 may comprise copper, stainless steel, gold, platinum, niobium, titanium, aluminum and/or the like. In some embodiments, conductive layers 12, 14 may be fabricated from carbon-based conductive materials, such as carbon fibre paper, carbon nanotubes, graphene-based material and/or the like, for example.

There are a number of reasons why it is advantageous for tri-layer actuator 10 to comprise conducting polymer conductive layers 12, 14. Conducting polymers can be made transparent or partially transparent (e.g. when provided in suitably thin layers with suitably low dopant levels) and when tri-layer actuator 10 comprises conducting polymer conductive layers 12, 14, at least part of tri-layer actuator 10 can be made transparent or partially transparent. Also, where tri-layer actuator 10 comprises conducting polymer conductive layers 12, 14, tri-layer actuator 10 may switch relatively quickly between configuration 10A (FIG. 1A), configuration 10B (FIG. 1B) and configuration 10C (FIG. 1C), as compared to when tri-layer actuator 10 is fabricated with metallic conductive layers 12, 14. Also, when compared to a tri-layer actuator fabricated from metallic conductive layers 12, 14, a tri-layer actuator fabricated from conducting polymer conductive layers 12, 14 may provide significantly larger strains (for a given applied voltage)—e.g. strains typically on the order of 1%-9% with the maximum reported strain of >35% (for conducting polymer conductive layers 12, 14) as compared to strains typically on the order of 0.5% (for metallic conductive layers 12, 14). Conducting polymer tri-layer actuators (i.e. tri-layer actuators 10 using conducting polymer conductive layers 12, 14) can actuate at relatively high speeds, when compared to tri-layer actuators using metallic (or other) materials for conductive layers 12, 14. It has been shown with suitable selection of materials, method of fabrication and actuator design, fast tri-layer actuations 10 with switching speeds as high as 1 kHz can be obtained using conducting polymer tri-layer actuators 10, while the frequency response of IPMC actuators (i.e. tri-layer actuators using metallic conductive layers 12, 14) is several tens of hertz.

In the illustrated embodiment of FIG. 1, when a positive voltage is applied between conductive layer 14 and conductive layer 12 (the polarity shown in FIG. 1B), anions are caused to move from conductive layer 12, through deformable layer 16 and into conductive layer 14. The withdrawal of ions from conductive layer 12 causes conductive layer 12 to contract. Conversely, the insertion of ions into conductive layer 14 (which can be as high as one ion for every three monomers in a conducting polymer conductive layer, in some embodiments) causes conductive layer 14 to expand. Together, the contraction of conductive layer 12 and expansion of conductive layer 14 cause a deformation of tri-layer actuator 10 (as shown in FIG. 1B), relative to the open circuit (or zero applied voltage) configuration shown in FIG. 1A. In the particular case of FIG. 1, the open circuit configuration of FIG. 1A is generally planar (the plane extending in the vertical direction of the page and into and out of the page in the illustrated FIG. 1A view); and the FIG. 1B deformation causes curvature of tri-layer actuator 10 out of the plane. When a negative voltage is applied between conductive layer 14 and conductive layer 12 (the polarity shown in FIG. 1C), anions are caused to move from conductive layer 14, through deformable layer 16 and into conductive layer 12. Conductive layer 14 contracts with the withdrawal of ions, conductive layer 12 expands with the insertion of ions and tri-layer actuator 10 is deformed (as shown in FIG. 1C) relative to the open circuit configuration shown in FIG. 1B. In the particular case of FIG. 1, the FIG. 1C deformation causes curvature of tri-layer actuator 10 out of the plane shown in the open circuit configuration shown in FIG. 1A and in a direction opposite to the curvature shown in FIG. 1B.

In FIG. 1, the FIG. 1A shape of tri-layer actuator 10 is shown as being associated with an open circuit configuration—i.e. leads 12A, 12B to respective conductive layers 12, 14 are shown as being open circuited. This FIG. 1A shape can be achieved with the illustrated open circuit. It will be appreciated that the FIG. 1A configuration of tri-layer actuator 10 can additionally or alternatively be achieved by application of zero volts between conductive layers 12, 14—e.g. by tying leads 12A, 14A to one another or by actively driving zero volts between leads 12A, 14A. Unless expressly indicated otherwise or the context specifically indicates otherwise, in this description and any accompanying claims, for brevity, the open circuit configuration shown in the FIG. 1A illustration may be described as an "application" of voltage (e.g. zero volts) between conductive layers 12, 14, even though a voltage is not specifically "applied" in the FIG. 1A open circuit configuration.

Tri-layer actuator 10 may be part of an apparatus or method for providing tactile stimulus to a human user. Such apparatus and methods may comprise an optional control circuit 18 which may be operatively connected to conductive layers 12, 14 and which is configurable to apply one or more different voltages between conductive layers 12, 14. Control circuit 18, which may comprise hardware, software, firmware or any combination thereof, may be implemented using any of a wide variety of components and corresponding control techniques. By way of non-limiting example, control circuit 18 may comprise a programmed computer system comprising one or more processors, user input apparatus, displays and/or the like. Control circuit 18 may be implemented as an embedded system and may share components (e.g. a processor) with the apparatus/device in which tri-layer actuator 10 is used. Control circuit 18 may comprise one or more microprocessors, digital signal processors, graphics processors, field programmable gate arrays, signal conditioning circuitry and/or hardware (e.g. amplifier circuits and/or the like) and/or the like. Components of control circuit 18 may be combined or subdivided, and components of control circuit 18 may comprise sub-components shared with other components of control circuit 18. Control circuit 18 need not be digital. In some embodiments, control circuit 18 could be implemented using suitable analog circuitry. Control circuit 18 may comprise one or more power supplies, amplifiers, driver circuits, thin film transistors, organic electronics and/or the like for application of voltages between conductive layers 12, 14.

In some embodiments (e.g. where conductive layers 12, 14 are conducting polymers), the applied voltages in FIG. 1B and 1C can have magnitudes less than 3V. In some embodiments, these magnitudes are less than 2V. In some embodiments (e.g. where conductive layers 12, 14 are conducting polymers), the deformations of tri-layer actuator 10 shown in FIGS. 1B and 1C are associated with strains that are greater than 1%. In some embodiments, these strains are greater than 5%. In some embodiments, these strains are greater than 8%. In some embodiments (e.g. where conductive layers 12, 14 are conducting polymers), conductive layers 12, 14 may have Young's modulus greater than 0.2 GPa. In some embodiments, these Young's modulus are greater than 0.5 GPa. In some embodiments, these Young's modulus are greater than 0.8 GPa. Unlike electric motors, little or no current is used to maintain the shape of tri-layer actuator 10 or any corresponding force generated by this shape. Tri-layer actuator 10 can be fabricated and/or patterned using a wide variety of techniques, including (without limitation), electroless or electrochemical deposition, dip coating, and inkjet printing, among other potentially low cost methods. In the FIG. 1 embodiment, the ambient shape of tri-layer actuator 10 (shown in FIG. 1A, where the applied voltage is zero) is a planar configuration. This shape is not necessary. In some embodiments, the ambient shape of tri-layer actuator 10 could be generally aligned with a different notional surface (e.g. a notional surface having some smooth or continuous curvature). In some such embodiments, application of a first voltage polarity may be associated with tri-layer actuator 10 having a first shape that has increased curvature (e.g. a smaller radius of curvature) relative to the notional curved surface and application of a voltage of a second polarity may be associated with tri-layer actuator 10 having a second shape that has decreased curvature (e.g. a large radius of curvature) relative to the notional curved surface.

In some embodiments, it is desirable for the deformation of tri-layer actuator 10 between the shapes of FIG. 1A and one of FIGS. 1B and 1C or between the shapes of FIG. 1B and 1C to provide-human detectable tactile stimulus. Such human-detectable tactile stimulus may be provided, for example, by providing a sufficient amount of shape change (and/or associated force) between the various shapes of tri-layer actuator 10. There are studies indicating that the minimum human detectable static tactile force at the fingertip is ~0.19 mN (for women) and 0.55 mN (for men). Consequently, in some embodiments, the minimum static force associated with the deformation of tri-layer actuator 10 between the shapes of FIG. 1A and one of FIGS. 1B and 1C or between the shapes of FIG. 1B and 1C is greater than 1 mN. In some embodiments, this minimum static force is greater than 10 mN. In some embodiments, this minimum static force is greater than 25 mN. In some embodiments, this minimum static force is greater than 100 mN. These minimum static forces may be positively correlated with minimum detectable deformation distances. However, these detectable force and/or deformation distance values may be lower if there is vibration (e.g. the shape changes, changes in force and/or change in deformation distances occur with sufficient frequency and/or in a desired frequency range). There are studies (see FIG. 15 and discussion of same below) indicating that the minimum human detectable dynamic displacement when grasping an object is at ~250+/−50 Hz and is on the order of approximately ~10 nm. Consequently, in some embodiments, the tri-layer actuators 10 are designed to be able to exhibit a minimum dynamic displacement (e.g. between the shapes of FIG. 1A and one of FIGS. 1B and 1C or between the shapes of FIG. 1B and 1C) at 250+/−100 Hz that is greater than 100 nm. In some embodiments, this minimum dynamic displacement for 250+/−100 Hz is greater than 300 nm. In some embodiments, this minimum dynamic displacements for 250+/−100 Hz is greater than 1000 nm. In some embodiments, the tri-layer actuators 10 are designed to be able to exhibit a minimum dynamic displacement (e.g. between the shapes of FIG. 1A and one of FIGS. 1B and 1C or between the shapes of FIG. 1B and 1C) at 50+/−25 Hz that is greater than 1000 nm. In some embodiments, this minimum dynamic displacements for 50+/−25 Hz is greater than 3000 nm.

Accordingly, in some embodiments, such human-detectable tactile stimulus may be provided, for example, by changing the shapes of tri-layer actuator 10 with sufficient frequency or in a desired frequency range. For example, control circuit 18 may be configured to change the applied voltage (e.g. between the voltage of FIG. 1A and one of the voltages of FIGS. 1B and 1C or between the voltages of FIG. 1B and 1C) and to thereby cause tri-layer actuator 10 to change its corresponding shape with corresponding frequencies or switching times which are detectable by human users. In some embodiments (e.g. where conductive layers 12, 14 are conducting polymers), the voltages applied to tri-layer actuator 10 may be changed (e.g. by control circuit 18) to cause corresponding shape changes (e.g. between the shape of FIG. 1A and one of the shapes of FIGS. 1B and 1C or between the shapes of FIG. 1B and 1C) at frequencies greater than 100 Hz. In some embodiments, this frequency is greater than 200 Hz. In some embodiments, this frequency is greater than 400 Hz. In some embodiments, this frequency is in a range of 250±100 Hz. In some embodiments, this frequency is in a range of 250±50 Hz. In some embodiments (e.g. where conductive layers 12, 14 are conducting polymers), the voltages applied to tri-layer actuator 10 may be changed (e.g. by control circuit 18) to cause corresponding shape changes (e.g. between the shape of FIG. 1A and one of the shapes of FIGS. 1B and 1C or between the shapes of FIG. 1B and 1C) with switching times less than 10 ms. In some embodiments, this switching time is less than 5 ms. In some embodiments, this switching time is less than 2.5 ms.

Where tri-layer actuator 10 is subjected to a high frequency voltage signal of a given amplitude (e.g. in any of the frequency ranges discussed in the preceding paragraph), tri-layer actuator 10 may be designed (e.g. with suitable dimensions and/or suitable selection of materials) to switch (e.g. between its first and second shapes) by a distance greater than a threshold percentage of the maximum deformation distance associated with the voltage amplitude. In some embodiments, this threshold percentage is greater than 50% of the maximum deformation distance associated with the voltage amplitude. In some embodiments, this threshold percentage is greater than 63%. In some embodiments, this threshold percentage is greater than 90%. In some embodiments, where tri-layer actuator 10 is subjected to a high frequency voltage signal of a given amplitude (e.g. in any of the frequency ranges discussed in the preceding paragraph), tri-layer actuator 10 may be designed (e.g. with suitable dimensions and/or suitable selection of materials) to switch between the first and second shapes with a switching time that is faster than that of an exponential ($e^{-t/\tau}$) having a time constant $\tau=2$ ms. In some embodiments, tri-layer actuator 10 switches with a switching time that is faster than that of an exponential ($e^{-t/\tau}$) having a time constant $\tau=1$ ms. In some embodiments, tri-layer actuator 10 switches with a switching time that is faster than that of an exponential ($e^{-t/\tau}$) having a time constant $\tau=0.5$ ms.

FIGS. 2A-2D (collectively, FIG. 2) respectively schematically depict cross-sectional views of a stimulus-providing portion 120 (e.g. a cell) of an apparatus 122 for providing tactile stimulus to a human user according to a particular embodiment. Stimulus-providing portion 120 of apparatus 122 (which may be referred to as apparatus 122, for brevity) may have substantially uniform cross-section in the dimension into an out of the page in the FIG. 2 view. In the FIG. 2 embodiment, apparatus 122 comprises a plurality of tri-layer actuators 10, each of which may be similar to that described above in connection with FIG. 1. FIGS. 2A-2D respectively depict apparatus 122 with different voltages applied to tri-layer actuators 10 and corresponding different shapes (as explained in more detail below). Tri-layer actuators 10 of apparatus 122 may generally be arranged along a notional surface 123 (a planar notional surface 123A, in the case of the FIG. 2 embodiment which extends in transverse direction shown by double-headed arrow 126 and into and out of the page in the illustrated FIG. 2 view) and are spaced apart from one another in the transverse direction 126. Surface 123 may be a notional or mathematical surface in the sense that surface 123 need not correspond precisely to any physical surface of apparatus 122, but may be used to describe the alignment of tri-layer actuators 10. One or more tri-layer actuators 10 may be described herein as being arranged along and/or aligned with a notional surface 123 if one or more layers of the tri-layer actuators 10 are generally arranged along and/or aligned with that surface 123 when the one or more tri-layer actuators 10 are in their ambient states (i.e. with zero applied voltage). FIG. 2A shows apparatus 122 with its tri-layer actuators 10 in their ambient states. In the FIG. 2A embodiment, the layers of tri-layer actuators 10 are generally arranged along a planar surface 123A (which extends in transverse direction shown by double-headed arrow 126 and into and out of the page in the illustrated FIG. 2 view) and the layers of individual tri-layer actuators 10 are aligned with planar surface 123A. In general, surface 123 need not be a planar surface 123A and surface 123A may have curvature. In the FIG. 2 embodiment, where surface 123 is planar, transverse directions are linear directions shown by arrow 126. In general, however, where surface 123 need not be planar and may have curvature, transverse directions may be understood to be directions tangential to surface 123.

In apparatus 122 of the FIG. 2 embodiment, the transverse edges of each tri-layer actuator 10 are connected to deformable members 124. In some embodiments, deformable members 124 may be provided by contiguous extensions of deformable layer 16 (FIG. 1) in the transverse directions beyond the transverse edges of first and second conductive layers 12, 14 to extend between transversely adjacent tri-layer actuators 10. It will be appreciated that when tri-layer actuators 10 are generally aligned with surface 123 in their ambient states, application of a non-zero voltage to any of tri-layer actuators 10 will cause those tri-layer actuators 10 to deform away from surface 123. In some embodiments, voltages can be applied to the conductive layers 12, 14 of tri-layer actuators 10 by a control circuit (similar to control circuit 18 described above) which, although not expressly shown in FIG. 2, may be part of apparatus 122.

FIG. 2B illustrates a configuration 122B of apparatus 122 where a first polarity voltage is applied between the conductive layers 12, 14 of each tri-layer actuator 10, causing at least a portion of tri-layer actuators 10 to bend in a first direction away from notional surface 123 (toward the bottom of the page in the FIG. 2 view). At least a portion of tri-layer actuators 10 may deform in a direction that is normal to notional surface 123 along which tri-layer actuators 10 are aligned. Each tri-layer actuator 10 may comprise a central portion and a pair of transverse portions on corresponding transverse sides of the central portion. With the applied voltages of FIG. 2B, for each tri-layer actuator 10, its central portion deforms away from surface 123 (e.g. in a direction normal to surface 123) by a distance that is greater than its respective transverse portions. Deformation having this characteristic provides tri-layer actuators 10 with the upwardly opening concave shape, in the illustrated FIG. 2B view. In some embodiments, the applied voltages of FIG. 2B and the corresponding deformation of tri-layer actuators 10 also cause some deformation of deformable members 124 in the regions at or near each of the transverse edges of each tri-layer actuator 10. In some embodiments, however, deformable members 124 are not necessary and tri-layer actuators 10 may be rigidly connected at one or both of their transverse edges. In some embodiments, apparatus 122 may comprise a combination of deformable members 124 and rigid members (not shown) between transversely adjacent pairs of tri-layer actuators 10.

FIG. 2C illustrates a configuration 122C of apparatus 122 where a second polarity voltage (opposed to the first polarity voltage) is applied between the conductive layers 12, 14 of each tri-layer actuator 10, causing at least a portion of tri-layer actuators 10 to bend in a second direction (toward the top of the page in the FIG. 2 view). As in the case of the application of the FIG. 2B voltages, application of the FIG. 2C voltages may cause at least a portion of tri-layer actuators 10 to deform in a direction that is normal to surface 123 along which tri-layer actuators 10 are aligned, except that with the opposing polarity voltage applied in the FIG. 2C, the direction of deformation with the FIG. 2C voltages may be opposite that of the FIG. 2B voltages. With the applied voltages of FIG. 2C, for each tri-layer actuator 10, its central portion may deform away from surface 123 (e.g. in a direction normal to surface 123) by a distance that is greater than its respective transverse portions. Deformation having this characteristics provides tri-layer actuators 10 with the downwardly opening concave shape, in the illustrated FIG. 2C view. In some embodiments, the applied voltages of FIG. 2C and the corresponding deformation of tri-layer actuators 10 also cause some deformation of deformable members 124 in the regions at or near each of the transverse edges of each tri-layer actuator 10. In some embodiments, however, deformable members 124 are not necessary and tri-layer actuators 10 may be rigidly connected at one or both of their transverse edges. In some embodiments, apparatus 122 may comprise a combination of deformable members 124 and rigid members (not shown) between transversely adjacent pairs of tri-layer actuators 10.

FIG. 2D illustrates a configuration 122D of apparatus 122 where a first and second opposing polarity voltages are applied to the conductive layers 12, 14 of transversely adjacent tri-layer actuators 10, causing alternating directions of deformation away from surface 123 for transversely adjacent tri-layer actuators 10. In the FIG. 2D configuration, each individual tri-layer actuator 10 may deform in a manner that is similar to one of tri-layer actuators 10 subject to the FIG. 2B voltage or that is similar to one of tri-layer actuators 10 subject to the opposing FIG. 2C voltage. It will be appreciated with the FIG. 2D configuration (i.e. with alternating directions of deformation away from surface 123 for transversely adjacent tri-layer actuators 10), the magnitude of the deformation between transversely adjacent tri-layer actuators 10 may be greater than that of the uniform polarity voltages applied in FIGS. 2B, 2C. It will be appreciated that the polarities of the voltages shown in the FIG. 2D configuration could be reversed, to provide apparatus 122 with a shape that is similar to that of FIG. 2D, but with the deformations of individual tri-layer actuators 10 reversed (i.e. with alternating directions of deformation away from surface 123 for transversely adjacent tri-layer actuators 10). Like the configurations described above for FIGS. 2B and 2C, the deformation of tri-layer actuators 10 under the FIG. 2D voltages may cause some deformation of deformable members 124 in the regions at or near each of the transverse edges of each tri-layer actuator 10. In some embodiments, however, deformable members 124 are not necessary and tri-layer actuators 10 may be rigidly connected at one or both of their transverse edges. In some embodiments, apparatus 12 may comprise a combination of deformable members 124 and rigid members (not shown) between transversely adjacent pairs of tri-layer actuators 10.

In the illustrated embodiment of FIGS. 2A-2D, the transverse direction 126 spatial period or pitch ($d_2$) is approximately twice the transverse direction dimension $d_5$ of each tri-layer actuator 10 and approximately twice the transverse direction dimension $d_1$ of the spacing between transversely adjacent pairs of tri-layer actuators 10 (i.e. $d_1=d_5=d_2/2$). This is not necessary. In some embodiments, tri-layer actuators 10 may occupy a greater portion (higher duty cycle) of spatial period $d_2$ (i.e. $d_5>d_1$). In some embodiments, tri-layer actuators 10 may occupy a smaller portion (lower duty cycle) of spatial period $d_2$ (i.e. $d_5<d_1$).

Apparatus 122 of FIGS. 2A-2D may comprise one or more additional layers of material or effectors (not shown) which may be located adjacent one or both sides of surface 123 and tri-layer actuators 10 aligned thereon. Such additional layer(s) may be used to increase surface roughness, enhancing the tactile perception of the stimulus caused by the deformations of tri-layer actuators 10.

Pacinian corpuscles are known as the most sensitive mechanoreceptors in the somatosensory system of the body. Pacinian corpuscles are responsive to vibrational stimuli with frequencies in a range between 50-500 Hz and can best detect vibration at frequencies near 250 Hz. Pacinian corpuscles can detect vibrations at 250 Hz with amplitudes as small as ~10 nm. In some embodiments, where tri-layer actuators 10 are fabricated with conducting polymer conductive layers 12, 14, apparatus 122 of FIG. 2 may be designed to stimulate Pacinian corpuscles by vibrating (e.g. between any of the configurations shown in FIGS. 2A-2D) at suitably high frequencies with displacement magnitudes which may be small but which are detectable by Pacinian corpuscles. In some embodiments, such switching frequencies are greater than 100 Hz. In some embodiments, such switching frequencies are greater than 200 Hz. In some embodiments, such switching frequencies are greater than 400 Hz. In some embodiments, where tri-layer actuators 10 are fabricated with conducting polymer conductive layers 12, 14, apparatus 122 of FIG. 2 may be designed to stimulate Pacinian corpuscles by changing shapes (e.g. between any of the configurations shown in FIGS. 2A-2D) with suitably fast switching times with displacement magnitudes which may be small but which are detectable by Pacinian corpuscles. In some embodiments, such switching times are less than 10 ms. In some embodiments, such switching times are less than 5 ms. In some embodiments, such switching times are less than 2.5 ms.

Where apparatus 122 is subjected to a high frequency voltage signal of a given amplitude (e.g. in any of the frequency ranges discussed in the preceding paragraph), tri-layer actuators 10 of apparatus 122 may be designed (e.g. with suitable dimensions and/or suitable selection of materials) to switch (e.g. between its first and second shapes) by a distance greater than a threshold percentage of the maximum deformation distance associated with the voltage amplitude. In some embodiments, this threshold percentage is greater than 50% of the maximum deformation distance associated with the voltage amplitude. In some embodiments, this threshold percentage is greater than 63%. In some embodiments, this threshold percentage is greater than 90%. In some embodiments, where apparatus 122 is subjected to a high frequency voltage signal of a given amplitude (e.g. in any of the frequency ranges discussed in the preceding paragraph), tri-layer actuators 10 of apparatus 122 may be designed (e.g. with suitable dimensions and/or suitable selection of materials) to switch between the first and second shapes with switching times that are faster than that of an exponential ($e^{-t/\tau}$) having a time constant $\tau=2$ ms. In some embodiments, tri-layer actuators 10 switch with switching times that are faster than that of an exponential ($e^{-t/\tau}$) having a time constant $\tau=1$ ms. In some embodiments, tri-layer actuators 10 switch with switching times that are faster than that of an exponential ($e^{-t/\tau}$) having a time constant $\tau 0.5$ ms.

As discussed above, such switching frequencies and response times may be effected by a control circuit (similar to control circuit 18 shown and described above in connection with FIG. 1, but not expressly shown in FIG. 2) which may control the corresponding voltages applied to tri-layer actuators 10. Tri-layer actuators 10 may achieve such switching frequencies and response times where conductive layers 12, 14 are fabricated from conducting polymers.

In some embodiments, the tri-layer actuators 10 of the FIG. 2 apparatus 122 are used to create a texture that can be detected by humans by moving a portion of their body (e.g. a fingertip) across the texture. Such movement of a finger (or other body part) across a tactile apparatus of the type described herein may be referred to as active tactile sensing (and may be contrasted with passive tactile sensing, where the finger (or other body part) that experiences the stimulation may be static). Embodiments configured to use active tactile sensing may not use vibration to provide human-detectable tactile stimulation. In comparison to vibrational (passive sensing) embodiments (which may use relatively thin tri-layer actuators 10 capable of relatively rapid switching), embodiments based on active sensing and human-detectable textures may be relatively thick and relatively stiff.

In some embodiments, the transverse spacing between transversely adjacent edges of tri-layer actuators 10 (shown as dimension $d_1$ in FIG. 2A) when tri-layer actuators 10 are in their ambient state (FIG. 2A) is in a range of 1 mm-50 mm (for vibrational embodiments) and 1 µm-100 µm (for texture-based embodiments). In some embodiments, this distance $d_1$ is in a range of 5 mm-10 mm (for vibrational embodiments) and 10 µm-40 µm (for texture-based embodiments). In some embodiments, the transverse spatial period or pitch of transversely adjacent tri-layer actuators 10 (shown as dimension $d_2$ in FIG. 2A) when tri-layer actuators 10 are in their ambient state (FIG. 2A) is in a range of 0.1 cm-10 cm (for vibrational embodiments) and 10 µm-1 mm (for texture-based embodiments). In some embodiments, this transverse spatial period or pitch $d_2$ is in a range of 1 cm-2 cm (for vibrational embodiments) and 50 µm-250 µm (for texture-based embodiments). In some embodiments, the maximum deformation distance of tri-layer actuators 10 away from surface 123 in directions normal to surface 123 (shown as distance $d_3$ in FIGS. 2B and 2C) is in a range of 25 nm-100 µm. In some embodiments, this distance $d_3$ is in a range of 100 nm-50 µm.

In some embodiments, the distance between the maximum deformations of transversely adjacent pairs of tri-layer actuators 10 in directions normal to surface 123 (shown as distance $d_4$ in FIG. 2D) is in a range of 50 nm-200 µm. In some embodiments, this distance $d_4$ is in a range of 200 nm-100 µm. In some embodiments, the spatial period (shown as $d_5$ in FIG. 2D) between the locations of maximum deformation in one direction is less than the distance $d_2$.

Figure 15:
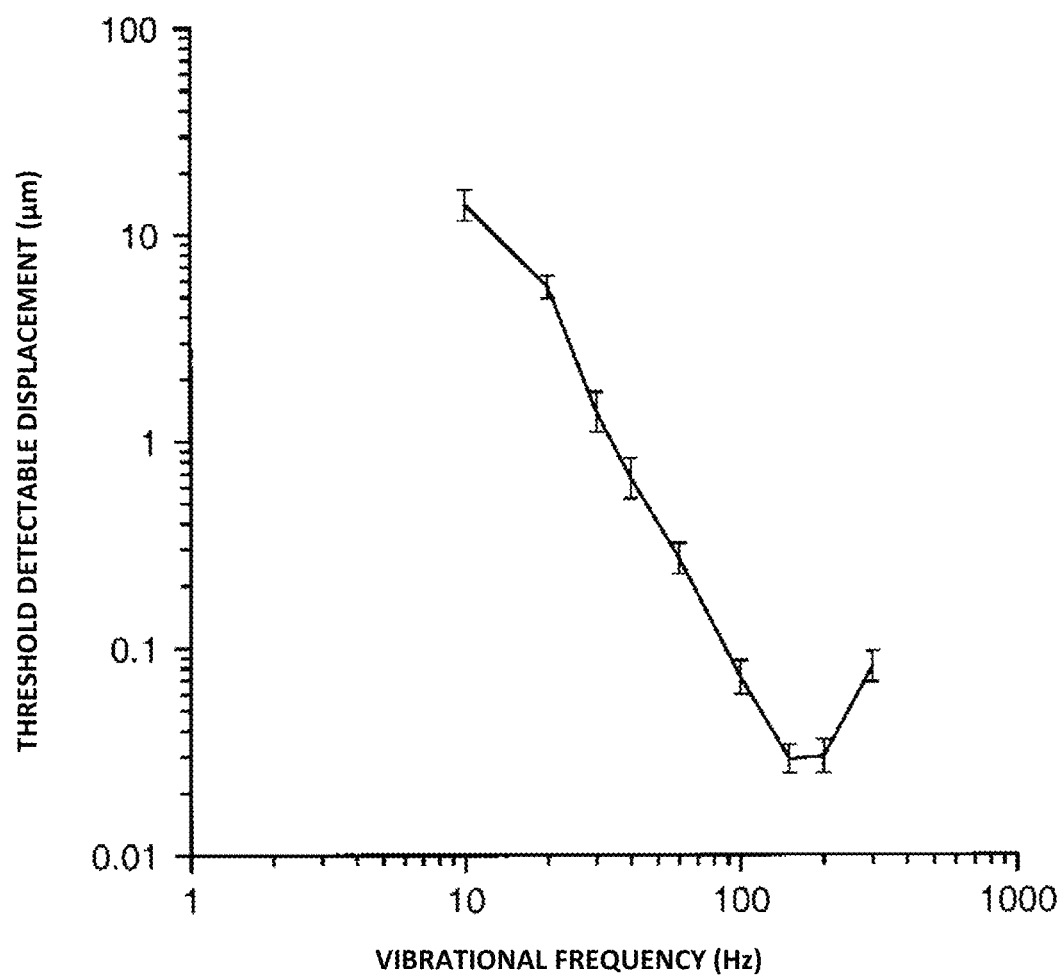
FIG. 15 illustrates a logarithmic plot of the minimum threshold detectable displacement (in μm) versus vibrational frequency (in Hz) as reported by Brisben, A. J., S. S. Hsiao, and K. O. Johnson. "Detection of vibration transmitted through an object grasped in the hand." *Journal of Neurophysiology* 81.4 (1999): 1548-1558.

As discussed above, it has been shown that for the humans, the minimum detectable (e.g. at the fingertip) change in deformation distance varies with frequency. FIG. 15 illustrates a logarithmic plot of the minimum threshold detectable displacement (in µm) versus vibrational frequency (in Hz) as reported by Brisben, A. J., S. S. Hsiao, and K. O. Johnson. "Detection of vibration transmitted through an object grasped in the hand." Journal of Neurophysiology 81.4 (1999): 1548-1558. FIG. 15 shows that for the particular illustrated data. humans can detect deformations as small as about 10 nm at frequencies of around 200 Hz.

In FIG. 2 embodiments designed for active tactile sensing, where the user moves their body part (e.g. their fingertip) relative to apparatus 122 to detect the stimulus, there is a desirability for apparatus 122 to be stiff. It will be appreciated that the stiffness of apparatus 122 depends not only on the Young's modulus of the materials from which it is fabricated, but also on the dimensions of the individual tri-layer actuators 10. Stiffness may be interpreted in units of force per unit length (of displacement). In some embodiments, the stiffness of apparatus 122 and/or the individual tri-layer actuators 10 that make up apparatus 122 is greater than the user's body part in contact with the region of the device). With this relative stiffness, when a user explores the surface of apparatus 122, he or she can do so without imposing any significant change to the shape generated by tri-layer actuators 10, assuming that the user applies force in a suitable range. It has been shown that the stiffness of the human fingertip is typically on the order of 1N/mm over an approximate fingertip area on the order of 1.5 cm$^2$. The stiffness of tri-layer actuators 10 in apparatus 122 should then be greater than this user-finger stiffness, multiplied by the area of apparatus 122 in contact with the finger divided by the approximate area of the fingertip (e.g. 1.5 cm$^2$). Design parameters for such active tactile sensing embodiments include, without limitation, the tri-layer actuator thickness $d_6$ (i.e. the distance between the external surfaces of conductive layers 12, 14—see FIG. 2), the deformation amounts $d_3$ and/or $d_4$ away from the nominal surface (e.g. plane 123) and the transverse spatial period $d_2$.

Table 1 below shows a number of geometries for apparatus 122 that have been considered. The data shown in Table 1 assumes: an embodiment of apparatus 122 like that shown in FIG. 2D (i.e. with transversely adjacent tri-layer actuators 10 subjected to alternating polarity voltage signals); that a user moves their fingertip across the surface of apparatus 122 with a constant speed of 10 mm/s; that $d_2=2d_5$ (i.e. the width $d_5$ of the tri-layer actuators 10 occupies half of the spatial period $d_2$—duty cycle of 50%); that the stiffness of a human user's fingertip is 1N/mm over an approximate fingertip area on the order of 1.5 cm$^2$; that the length (into and out of the page in the FIG. 2 view) is arbitrary; that the applied voltage signal is 4V peak to peak and the strain associated to that is 2%. Table 1 shows apparatus 122 with a number of different tri-layer actuator thicknesses $d_6$ (moving along Table 1 from left to right) and a number of different widths $d_5$ (moving along Table 1 from top to bottom). Each combination of the parameters $d_5$ and $d_6$ yields a stiffness for the corresponding tri-layer actuators 10. For each geometry, Table 1 shows a ratio (kk) of the stiffness of the tri-layer actuators 10 to the assumed stiffness of the human fingertip. Each combination of the parameters $d_5$ and $d_6$ yields a corresponding deformation distance $d_4$. Table 1 also shows a perceptual frequency $f_p$ for the active sensing embodiment, where the perceptual frequency $f_p$ is the assumed speed of fingertip movement (10 mm/s) divided by the spatial period of the tri-layer actuators 10 ($d_2=2d_5$).

deflections $d_4$ that are either insufficiently stiff or below the threshold perception indicated in the FIG. 15 plot (i.e. are not perceivable to the human touch according to the FIG. 15 data).

Table 1 shows that for tri-layer actuators 10 that have relatively small widths (small $d_5$), it is desirable for the tri-layer actuators to be relatively thin (small $d_6$), so that a suitably large deformation (large $d_4$) can be obtained. However, for tri-layer actuators 10 that have relatively small widths (small $d_5$), a limit on the thin-ness (small $d_6$) is reached when the tri-layer actuator becomes insufficiently stiff (kk ratio too small) to be perceived by the fingertip of the user. The Table 1 geometries corresponding to bolded cells above and/or to the left of the Table 1 geometries corresponding to the non-bolded cells represent geometries which may have suitable stiffness ratios, but which may exhibit frequency/deformation combinations that fall below the FIG. 15 perceivable thresholds. The Table 1 geometries corresponding to bolded cells below and/or to the right of the

TABLE 1

Geometries Considered for Apparatus 122 (FIG. 2)

| Perceptual frequency $f_p$ (Hz) | Tri-layer actuator width $d_5$ (μm) | Tri-layer actuator thickness $d_6$ (μm) | | | | | | | | | | |
|---|---|---|---|---|---|---|---|---|---|---|---|---|
| | | 600 | | 190 | | 60 | | 27 | | 11 | | 9.5 |
| | | Stiffness ratio (kk) | $d_4$ (nm) | kk | $d_4$ (nm) | kk | $d_4$ (nm) | kk | $d_4$ (nm) | kk | $d_4$ (nm) | kk | D (nm) |
| 250 | 20 | ** / 6.2×10$^9$ / ** | ** / 6 / ** | ** / 2×10$^8$ / ** | ** / 20 / ** | ** / 6.2×10$^6$ / ** | ** / 65 / ** | 5.6×10$^5$ | 145 | 3.8×10$^4$ | 356 | 2.5×10$^4$ | 411 |
| 200 | 25 | ** / 2.5×10$^9$ / ** | ** / 10 / ** | ** / 8×10$^7$ / ** | ** / 32 / ** | 2.5×10$^6$ | 100 | 2.3×10$^5$ | 230 | 1.5×10$^4$ | 560 | 1×10$^4$ | 650 |
| 150 | 33 | ** / 8×10$^8$ / ** | ** / 17 / ** | ** / 2.5×10$^7$ / ** | ** / 55 / ** | 8.5×10$^5$ | 175 | 7.5×10$^4$ | 400 | 5×10$^3$ | 950 | 3×10$^3$ | 1100 |
| 100 | 50 | ** / 1.5×10$^8$ / ** | ** / 40 / ** | 5×10$^6$ | 130 | 1.5×10$^5$ | 400 | 1.4×10$^4$ | 900 | 1000 | 2200 | 650 | 2600 |
| 50 | 100 | ** / 1×10$^7$ / ** | ** / 160 / ** | 3.1×10$^5$ | 510 | 1×10$^4$ | 1600 | 900 | 3600 | 60 | 8900 | 40 | 1×10$^4$ |
| 25 | 200 | ** / 6.2×10$^5$ / ** | ** / 650 / ** | 2×10$^4$ | 2×10$^3$ | 620 | 6.5×10$^3$ | 55 | 1.4×10$^3$ | ** / 4 / ** | ** / 3.5×10$^4$ / ** | ** / 3 / ** | ** / 4×10$^4$ / ** |
| 12.5 | 400 | 4×10$^4$ | 2600 | 1200 | 8200 | 40 | 2.5×10$^4$ | ** / 3.5 / ** | ** / 5.7×10$^4$ / ** | ** / 0.2 / ** | ** / 1.4×10$^5$ / ** | ** / 0.15 / ** | ** / 1.5×10$^5$ / ** |
| 5 | 1000 | 1000 | 1.6×10$^4$ | 30 | 5×10$^4$ | ** / 1 / ** | ** / 1.6×10$^5$ / ** | ** / 0.08 / ** | ** / 3.5×10$^5$ / ** | ** / 0.006 / ** | ** / 6.7×10$^5$ / ** | ** / 0.004 / ** | ** / 7×10$^5$ / ** |

Several observations can be made from the Table 1 data. For each of the Table 1 geometries, pairs of perceptual frequencies $f_p$ and deformation distances $d_4$ can be compared to the FIG. 15 plot of minimum threshold detectable displacement (in μm) versus vibrational frequency (in Hz) that is perceivable. The geometries having thicknesses $d_6$ and widths $d_5$ corresponding to the non-bolded cells in FIG. 1 yield combinations of stiffness ratios kk, perceptual frequencies $f_p$ and/or deflections $d_4$ that are suitably stiff and within the threshold perception indicated in the FIG. 15 plot (i.e. are perceivable to the human touch according to the FIG. 15 data). The geometries having thicknesses $d_6$ and widths $d_5$ corresponding to the bolded cells in FIG. 1 yield combinations of stiffness ratios kk, perceptual frequencies $f_p$ and/or Table 1 geometries corresponding to the non-bolded cells represent geometries which may exhibit frequency/deformation combinations that meet the FIG. 15 perceivable thresholds, but which may have insufficient stiffness.

In some embodiments, deformable members 124 may be readily deformable by the tri-layer actuator 10 so that tri-layer actuator 10 may deform by a significant fraction of the its free deformation, as would occur in the absence of the deformable member 124. In some embodiments this fraction of deformation is greater than 25%. In some embodiments this fraction of deformation is greater than 70%. The ratio of the width of tri-layer actuator 10 ($d_5$ in FIG. 2) to the transverse spatial period ($d_2$ in FIG. 2), with this ratio $d_5/d_2$ referred to as the duty cycle, is set sufficiently low to enable significant deformation. In some embodiments the duty cycle will be 50% or less. In some embodiments in which the deformable member is compliant and a large deformation ($d_3$ or $d_4$ in FIG. 2) is desired, for a tri-layer actuator thickness $d_6$ having particular conductive layer and deformable layer thicknesses $h_p$, $h_g$ and elastic moduli, the duty cycle will be greater than or equal to 50%. In some embodiments, this duty cycle is greater than 70%. In some embodiments where it is desired for tri-layer actuators 10 to have high stiffness, for a tri-layer actuator thickness $d_6$ having particular conductive layer and deformable layer thicknesses $h_p$, $h_g$ and elastic moduli, the duty cycle may be less than 20%.

In FIG. 2 embodiments designed for passive tactile sensing, e.g. where the user is permitted to maintain their body part (e.g. their fingertip) static relative to apparatus 122 to detect the stimulus, there is a desirability for apparatus 122 to be stiff and for tri-layer actuators 10 to generate sufficient force to be perceivable to the user's sense of touch. In some embodiments, the stiffness of apparatus 122 and/or the individual tri-layer actuators 10 that make up apparatus 122 is greater than the user's body part in contact with the region of the device). With this relative stiffness, when a user explores the surface of apparatus 122, he or she can do so without imposing any significant change to the shape generated by tri-layer actuators 10, assuming that the user applies force in a suitable range. It will be appreciated that these factors (stiffness and force) combine to create displacement in the user's passive body part (e.g. the user's fingertip).

As shown in FIG. 15, there may be a desirability for tri-layer actuators 10 to switch at frequencies above particular frequencies or within particular frequency ranges to maximize the human ability to passively perceive such switching with their sense of touch. The inventors have identified three time constants which can limit the switching frequency of a tri-layer actuator 10. These time constants include:

(i) a time constant $\tau_1$ associated with how fast ions can travel through deformable layer 16:

$$\tau_1 = R_s C = R_s C_V \cdot V = C_V \frac{h_p h_g}{2\sigma_{IN}} \quad (1)$$

where $R_s$ is the resistance of deformable layer 16 to ionic conduction, C is the internal capacitance of each conductive layers 12, 14, $C_V$ is the internal capacitance of each conductive layer 12, 14 per unit volume, V is the volume of each conductive layer 12, 14, $h_p$ is the thickness (in the direction of $d_6$ illustrated in FIG. 2) of each conducting layer 12, 14 (assuming they both have the same thickness); $h_g$ is the thickness (in the direction of $d_6$ illustrated in FIG. 2) of deformable layer 16; and $\tau_{IN}$ is the ionic conductivity of deformable layer 16.

(ii) a time constant $\tau_2$ associated with how fast electrons can travel along a width of tri-layer actuator 10:

$$\tau_2 = R_{ppy} C = C_V \frac{(d_*)^2}{\sigma_E} \quad (2)$$

where $R_{ppy}$ is the resistance of conductive layers 12, 14 to electronic conduction, $d^*$ is the maximum distance of the tri-layer actuator 10 over which electronic transport occurs within the conducting layer 12, 14 (as opposed to within a metallic electrode) and $\sigma_E$ is the electronic conductivity of conductive layers 12, 14. For example, in FIG. 3 embodiment, where the electrode 136 only extends a short distance along the length $d_7$ of tri-layer actuator 10, then $d^* \sim d_7$. However, where electrode 136 extends an appreciable distance along the length $d_7$ of tri-layer actuator 10, then $d^*$ may be considerably less than $d_7$. As another example, where a width of electrode 136 in the FIG. 3 embodiment is significantly less than $d_5$ and extends along the length of $d_7$, then $d^*$ may be approximately equal to $d_5$.

(iii) a time constant $\tau_3$ associated with how fast ions can move through conductive layers 12, 14:

$$\tau_3 = R_{ion} C = C_V \frac{h_p^2}{\sigma_{IP}} \quad (3)$$

where $R_{ion}$ is the resistance of conductive layers 12, 14 to ionic conduction, and $\sigma_{IP}$ is the ionic conductivity of conductive layers 12, 14.

Table 2 below shows approximate values of a number of the parameters associated with the time constants $\tau_1$, $\tau_2$, $\tau_3$ expressed in equations (1), (2) and (3) above, where tri-layer actuators 10 are fabricated using PEDOT electrically conductive polymer and IPN (interpenetrating polymer network, such as a combination of polyethylene oxide and nitrile rubber) using 1M solutions of different electrolytes (either LiTFSI (bis(trifluoromethane)sulfonimide lithium salt) or EMITFSI (1-ethyl-3-methylimidazolium bis(trifluoromethylsulfonyl)imide).

TABLE 2

Electrical and Electrochemical properties of a PEDOT conducting polymer actuator

| Parameter | Notation | Value |
| --- | --- | --- |
| Volumetric Capacitance | $C_V$ | $2.7 \times 10^7$ F/m$^3$ |
| Electronic conductivity of PEDOT | $\sigma_E$ | $10^4$ S/m |
| Ionic conductivity of PEDOT in 1M LiTFSI | $\sigma_{P-LiTFSI}$ | 0.04 S/m |
| Ionic conductivity of PEDOT in 1M EMITFSI | $\sigma_{P-EMITFSI}$ | 0.03 S/m |
| Ionic conductivity of IPN in 1M LiTFSI | $\sigma_{IPN-LiTFSI}$ | 0.106 S/m |
| Ionic conductivity of IPN in 1M EMITFSI | $\sigma_{IPN-EMITFSI}$ | 0.08 S/m |
| Contact resistance | $R_C$ | 1.9 Ω |

The time constants $\tau_1$, $\tau_2$, $\tau_3$ expressed in equations (1), (2) and (3) above together with the frequency/deformation thresholds shown in FIG. 15 can be used to evaluate various geometries of apparatus 122 in terms of the geometric parameters including the tri-layer actuator width $d_5$ (see FIG. 2), the thickness $h_p$ of conductive layers 12, 14 and the thickness $h_g$ of deformable layer 16. In particular, it may be desirable in some embodiments, for tri-layer actuators 10 to have maximum parameters $d_5$, $h_p$ and $h_g$ to achieve desired time constants $\tau_1$, $\tau_2$, $\tau_3$ and desired frequency/deformation thresholds. It will be appreciated from the different conductivities in Table 2 that such parameters $d_5$, $h_p$ and $h_g$ may depend on the materials used to fabricate tri-layer actuators 10. Table 3 below shows some desirable maximum parameters $d_5$, $h_p$ and $h_g$ for tri-layer actuators 10 of apparatus 122. The data shown in Table 3 uses the same assumptions as those discussed above in connection with Table 1.

TABLE 3

Values of parameters $d_5$, $h_p$ and $h_g$ for various switching frequencies and various tri-layer actuator fabication techniques

| | Frequency (Hz) | | | | | | | |
|---|---|---|---|---|---|---|---|---|
| | 0.1 | | 1 | | 10 | | 50 | |
| | Electrolyte | | | | | | | |
| | LiTFSI | EMITFSI | LiTFSI | EMITFSI | LiTFSI | EMITFSI | LiTFSI | EMITFSI |
| MAX desired conductive layer (12, 14) thickness $h_p$ (μm) | 86 | 74 | 27 | 23 | 8.6 | 7.4 | 3.8 | 3.3 |
| MAX desired deformable layer (16) thickness $h_g$ (μm) | 215 | 198 | 68 | 63 | 21 | 20 | 10 | 9 |
| MAX desired width $d_5$ (mm) (FIG. 2 embodiment) | | 86 | | 28 | | 8.6 | | 3.8 |

| | Frequency (Hz) | | | | | |
|---|---|---|---|---|---|---|
| | 100 | | 250 | | 400 | |
| | LiTFSI | EMITFSI | LiTFSI | EMITFSI | LiTFSI | EMITFS |
| Electrolyte MAX desired conductive layer (12, 14) thickness $h_p$ (μm) | 2.7 | 2.3 | 1.7 | 1.36 | 1.2 | 1.2 |
| MAX desired deformable layer (16) thickness $h_g$ (μm) | 6.8 | 6.3 | 4.3 | 4 | 3.4 | 3.1 |
| MAX desired width $d_5$ (mm) (FIG. 2 embodiment) | | 2.6 | | 1.7 | | 1.4 |

In the cantilever configuration of FIG. 1 where one end of tri-layer actuator 10 is unconstrained, the maximum desired width $d_5$ (which may be referred to as a length in the context of the FIG. 1 embodiment) may be approximately half of that of the FIG. 2 apparatus 122, since, for a given geometry, the FIG. 1 embodiment may achieve greater deformation distances at the expense of reduced stiffness.

Table 4 below shows data similar to that described above in Table 1 for passive tactile sensing versions of apparatus 122 (FIG. 2).

TABLE 4

Geometries Considered for Apparatus 122 (FiG. 2) for Passive Tactile Sensing Apparatus Tri-layer actuator thickness $d_6$ (μm)
Assume Max values of $h_p$ and $h_z$ from Table 3

| Tri-layer actuator width $d_5$ (μm) -- | | 60 | | 27 | | 19 | | 11 | | 9.5 |
|---|---|---|---|---|---|---|---|---|---|---|
| all of the widths in this column are smaller than the maximum of Table 3 | | | | | Corresponding actuation frequency (Hz) | | | | | |
| | | 10 | | 50 | | 100 | | 250 | | 400 |
| | stiffness ratio (kk) | $d_4$ (nm) | kk | $d_4$ (nm) | kk | $d_4$ (nm) | kk | $d_4$ (nm) | kk | $d_4$ (nm) |
| 20 | ** 6.2 × 10$^6$ ** | ** 65 ** | ** 5.6 × 10$^5$ ** | ** 145 ** | 2 × 10$^4$ | 200 | 3.8 × 10$^4$ | 356 | 2.5 × 10$^4$ | 411 |
| 25 | ** 2.5 × 10$^6$ ** | ** 100 ** | ** 2.3 × 10$^5$ ** | ** 230 ** | 8 × 10$^4$ | 320 | 1.5 × 10$^4$ | 560 | 1 × 10$^4$ | 650 |
| 33 | ** 8.5 × 10$^5$ ** | ** 175 ** | ** 7.5 × 10$^4$ ** | ** 400 ** | 2.6 × 10$^4$ | 560 | 5 × 10$^3$ | 950 | 3 × 10$^3$ | 1100 |
| 50 | ** 1.5 × 10$^5$ ** | ** 400 ** | 1.4 × 10$^4$ | 900 | 5 × 10$^3$ | 1290 | 1000 | 2200 | 650 | 2600 |
| 100 | ** 1 × 10$^4$ ** | ** 1600 ** | 900 | 3600 | 320 | 5140 | 60 | 8900 | 40 | 1 × 10$^4$ |
| 200 | 620 | 6.5 × 10$^3$ | 55 | 1.4 × 10$^4$ | 20 | 2 × 10$^4$ | ** 4 ** | ** 3.5 × 10$^4$ ** | ** 3 ** | ** 4 × 10$^4$ ** |
| 400 | 40 | 2.5 × 10$^4$ | ** 3.5 ** | ** 5.7 × 10$^4$ ** | ** 1 ** | ** 8 × 10$^4$ ** | ** 0.2 ** | ** 1.4 × 10$^5$ ** | ** 0.15 ** | ** 1.5 × 10$^5$ ** |
| 1000 | ** 1 ** | ** 1.6 × 10$^5$ ** | ** 0.08 ** | ** 3.5 × 10$^5$ ** | ** 0.03 ** | ** 4.7 × 10$^5$ ** | ** 0.006 ** | ** 6.7 × 10$^5$ ** | ** 0.004 ** | ** 7 × 10$^5$ ** |

Several observations can be made from the Table 4 data. For each of the Table 4 geometries, pairs of actuation frequencies and deformation distances $d_4$ can be compared to the FIG. 15 plot of minimum threshold detectable displacement (in μm) versus vibrational frequency (in Hz) that is perceivable. The geometries having thicknesses $d_6$ and widths $d_5$ corresponding to the non-bolded cells in FIG. 1 yield combinations of stiffness ratios kk, frequencies and/or deflections $d_4$ that are suitably stiff and within the threshold perception indicated in the FIG. 15 plot (i.e. are perceivable to the human touch according to the FIG. 15 data). The geometries having thicknesses $d_6$ and widths $d_5$ corresponding to the bolded cells in FIG. 1 yield combinations of stiffness ratios kk, frequencies and/or deflections $d_4$ that are either insufficiently stiff or below the threshold perception indicated in the FIG. 15 plot (i.e. are not perceivable to the human touch according to the FIG. 15 data).

Table 4 shows that for tri-layer actuators 10 that have relatively small widths (small $d_5$), it is desirable for the tri-layer actuators to be relatively thin (small $d_6$), so that a suitably large deformation (large $d_4$) can be obtained. However, for tri-layer actuators 10 that have relatively small widths (small $d_5$), a limit on the thin-ness (small $d_6$) is reached when the tri-layer actuator becomes insufficiently stiff (kk ratio too small) to be perceived by the fingertip of the user. The Table 4 geometries corresponding to bolded cells above and/or to the left of the Table 4 geometries corresponding to the non-bolded cells represent geometries which may have suitable stiffness ratios, but which may exhibit frequency/deformation combinations that fall below the FIG. 15 perceivable thresholds. The Table 4 geometries corresponding to bolded cells below and/or to the right of the Table 4 geometries corresponding to the non-bolded cells represent geometries which may exhibit frequency/deformation combinations that meet the FIG. 15 perceivable thresholds, but which may have insufficient stiffness.

FIGS. 3A-3E (collectively, FIG. 3) schematically depict a method for fabricating the FIG. 2 apparatus 122 according to an exemplary non-limiting embodiment. The FIG. 3 method schematically depicts a fabrication technique for a cell 128 of apparatus 122 comprising six tri-layer actuators 10. It will be appreciated that apparatus 122 may comprise one or a plurality of cells 128 of the type shown in FIG. 3 and that cell 128 may comprise a different number of tri-layer actuators 10. The FIG. 3 method starts in FIG. 3A with fabrication of a layer 130 comprising a combination of two or more cross-linked polymers used to synthesize a solid polymer electrolyte (SPE) which will eventually become the deformable layer 16 of tri-layer actuators 10 and deformable members 124 connected between transversely adjacent pairs of tri-layer actuators 10. In the illustrated embodiment of FIG. 3, the mixture of polymers may be poured into a mold (optionally pre-coated with polyvinyl alcohol (PVA) as an underlayer). Layer 130 may then be peeled away from the mold after suitable thermal treatments and after optional solubilization of PVA into water. The resultant SPE layer 130 shown in FIG. 3A may comprise a film of ~5 μm-200 μm thick.

Conductive layers 12, 14 of tri-layer actuators 10 may then be fabricated. In the illustrated embodiment of FIG. 3, conductive layers 12, 14 are fabricated using poly(3,4-ethylenedioxythiophene) Polystyrene sulfonate (PEDOT), which is a conducting polymer material. As shown in FIG. 3B, SPE layer 130 may be coated on both sides with layers 132, 134 of PEDOT. PEDOT layers 132, 134 can be created by soaking the layer 130 into pure ehylenedioxythiophene (EDOT) and then immersing into a solution of $FeCl_3$ for a length of time to polymerize the EDOT and thereby form PEDOT layers 132, 134. PEDOT layers 132, 134 are patterned in FIG. 3C. PEDOT layer 132, 134 may be patterned using laser micromachining or any other suitable patterning technique. In some embodiments, thin regions of PEDOT are removed from PEDOT layers 132, 134 to create tri-layer actuators 10 which are spaced apart from one another in transverse directions 126.

Electrical contacts 136 are then added as shown in FIG. 3D. Electrical contacts 136 may be added at the ends, or be extended along the length, of tri-layer actuators 10 (or any other suitable locations on tri-layer actuators 10) using a shadow mask process or any other suitable process. Then, as shown in FIG. 3E, the construction may be mounted on a rigid substrate 138 which permits deformation of tri-layer actuators 10 between the connection points on the rigid substrate. In the FIG. 3E embodiment, the transversely outermost edges 140, 142 of the construction are rigidly mounted to supports 138A of substrate 138 which are generally elongated in longitudinal directions (shown by double-headed arrow 144) parallel to the edges of tri-layer actuators 10. FIG. 3E of the illustrated embodiment shows that substrate 138 may have a concavity 139 between supports 138 into which tri-layer actuators 10 may deform in some embodiments.

Aspects of the invention provide methods and apparatus for providing tactile stimulus to human users which involves the use of stimulus forces which may be oriented in transverse directions. Although FIGS. 3C-3E depict linear strips of tri-layer actuators, such tri-layer actuators can have different shapes and orientations. For example, tri-layer actuators can be oriented in a 2D array (e.g. row/column configuration), have hexagonal shapes and/or the like.

FIGS. 4A-4C (collectively, FIG. 4) depict perspective (FIG. 4A) and cross-sectional (FIGS. 4B and 4C) views of a portion (e.g. a cell) 228 of an apparatus 222 which may be used to provide human-detectable tactile stimulus according to another particular embodiment. The stimulus provided by portion 228 of apparatus 222 (which may be referred to herein as apparatus 222 for brevity) may be oriented (at least in part) in transverse directions indicated (in the FIG. 4 embodiment) by double-headed arrow 226. Such transverse directions may be directions that are parallel to or tangential to a substrate 225 of apparatus 222 or parallel to or tangential to the general (e.g. macroscopic) surface where users interact with apparatus 222.

Apparatus 222 comprises one or more tri-layer actuators 10 which may be similar to tri-layer actuators 10 of FIG. 1 described above. Tri-layer actuators 10 are shown schematically in FIG. 4. Tri-layer actuators 10 of apparatus 222 are connected at one of their edges 211 (which may be referred to herein as first edges 211) to a rigid member 213 (which may be referred to herein as frame 213). First edges 211 of tri-layer actuators 10 may be connected individually to corresponding frames 213 or pluralities of tri-layer actuators 10 may have their first edges 211 connected to a common frame 213. Tri-layer actuators 10 may be cantilevered such that distal edges 215 of tri-layer actuators 10 (i.e. edges 215 of tri-layer actuators 10 opposed to first edges 211) may be free to move relative to frame(s) 213.

When tri-layer actuators 10 are in their ambient states (i.e. a zero voltage applied between conductive layers 12, 14 of tri-layer actuators 10), tri-layer actuators 10 may have first shapes, where distal edges 215 of tri-layer actuators 10 may have corresponding first linear distances from first edges 211. This is the configuration shown in FIG. 4B, where the first shapes of tri-layer actuators 10 are generally planar and the first distance between first edges 211 and distal edges 215 is shown as $d_{10}$. When voltages are applied between conductive layers 12, 14 of tri-layer actuators 10, tri-layer actuators 10 may deform to have second shapes where one of conductive layers 12, 14 is contracted and the other one of conductive layers 12, 14 is expanded to cause tri-layer actuators 10 to bend into the second shapes shown in FIG. 4C. In the second shapes shown in FIG. 4B, distal edges 215 of tri-layer actuators 10 are at second linear distances (shown as $d_{11}$ in FIG. 4C) from first edges 211 of tri-layer actuators 10. In particular, in the case of the illustrated embodiment of FIG. 4, for each tri-layer actuator 10, the second shape is relatively more curved (e.g. has a smaller radius of curvature) than the first shape and, consequently, second distances $d_{11}$ between its first edge 211 and its distal edge 215 (FIG. 4C) is less than the first distance $d_{10}$ between its first edges 211 and its distal edge 215 (FIG. 4B). In the case of the illustrated embodiment of FIG. 4, the first shape (FIG. 4B) is generally planar (which has a notionally infinite radius of curvature), but this is not necessary. In some embodiments, the first and second shapes may both be curved and one of the first and second shapes may have a greater curvature (smaller radius of curvature), such that the linear distance between first edges 211 and distal edges 215 is relatively small for the shape with greater curvature and relatively large for the shape with less curvature.

In addition or in the alternative, frame 213 or some other rigid portion of apparatus 222 may be shaped to provide a concavity 219 having a dimension (e.g. a depth), and/or tri-layer actuators 10 may be oriented at angles, which prevent or minimize the extension or tri-layer actuators 10 outside of concavity 219 and the corresponding interaction between human body surface 217 (e.g. fingertip surface 217) and tri-layer actuators 10 when tri-layer actuators 10 are in a first shape. This first shape of tri-layer actuators 10 may correspond to their ambient states (i.e. a zero voltage applied between conductive layers 12, 14 of tri-layer actuators 10), although this is not necessary and the first shape of tri-layer actuators 10 may correspond to any suitable applied voltage. This is the configuration shown in FIG. 4B. When different voltages are applied between conductive layers 12, 14 of tri-layer actuators 10, tri-layer actuators 10 may deform to have second shapes, where one of conductive layers 12, 14 is contracted and the other one of conductive layers 12, 14 is expanded to cause tri-layer actuators 10 to bend to have orientations that cause tri-layer actuators 10 (or at least their distal edges 215) to project beyond the dimension (e.g. depth) of concavity 219 so that tri-layer actuators 10 and/or their distal edges 215 are detectable by fingertip surface 217.

In some embodiments, any of the tri-layer actuators 10 in any of the embodiments described herein may be covered by a thin layer of encapsulant (not shown), such as Kalex, silicone and/or the like to minimize direct contact between tri-layer actuators 10 and fingertip surface 217 and/or other aspects of the external environment. Such encapsulating layers, which may be used with any of the tactile stimulus apparatus and methods described herein, may minimize ion exchange, solvent insertion and/or other effects arising from contact with skin which may impact the operation of tri-layer actuators 10.

Figure 5B:
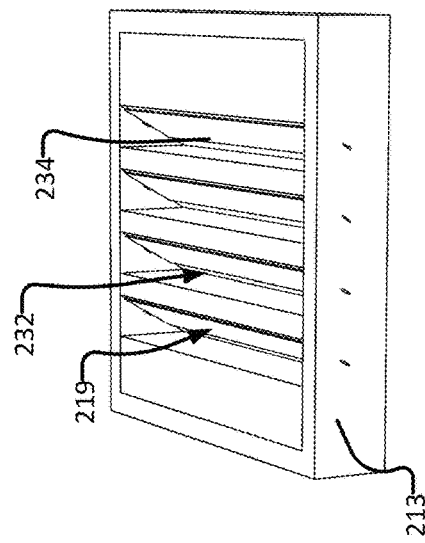
Figure 5A:
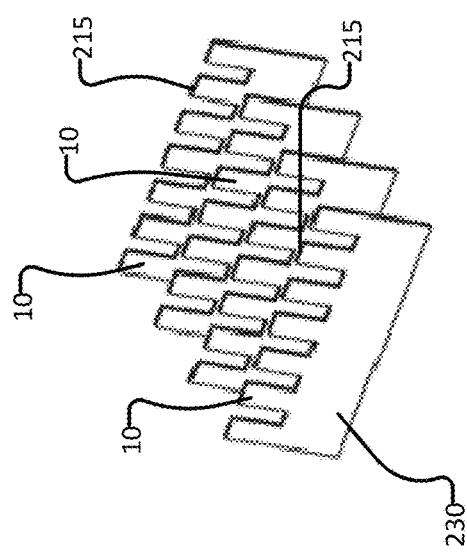

FIGS. 5A-5C (collectively, FIG. 5) schematically depict a method for fabricating the FIG. 4 apparatus 222 according to an exemplary non-limiting embodiment. In FIG. 5A, one or more sheets 230 of tri-layer actuators 10 (having conducting polymer conductive layers 12, 14 and deformable layer 16, as shown in FIG. 1) are fabricated either by using the method of FIG. 3 described above or using polyvinylidene fluoride (PVDF) membranes covered on both sides with Polypyrrole. In the latter method, PVDF membranes which are commercially available products with thicknesses of 110 µm and pore sizes of 0.45 µm may be covered on both sides with a very thin film of gold (<100 nm) using vacuum deposition methods, such as sputtering, electron beam evaporation and/or the like. Then a polypyrolle film may be galvanostatically deposited on both sides of the sample at (e.g. at current densities between 0.1-0.2 mA/s for 8-15 hrs) from a solution containing defined portions of Propylene Carbonate, distilled Pyrolle, deionized water and a salt (e.g. LiTFSI) which may serve as a dopant. Sheets 230 may have sizes on the order of 0.25 cm×0.25 cm to 1 cm×1 cm, in some embodiments. In some embodiments, the spacings between adjacent edges of tri-layer actuators 10 may be in a range of 1 mm-3 mm, the tri-layer actuator widths may be in a range of 0.5 mm-3 mm and tri-layer actuator pitch may be in a range of 1.5 mm-6 mm. In some embodiments, the length of each cantilevered tri-layer actuator 10 may be a range of 2 mm-6 mm.

Sheets 230 of tri-layer actuators 10 may then be laser cut or otherwise shaped into the cantilever structure shown in FIG. 5A (i.e. with distal edges 215 that are spaced apart from one another and free to move individually relative to the remainder of sheet 230) with dimensions as specified or otherwise desired. A frame 213 defining a concavity 219 may be made to house tri-layer actuators 10 in an angular orientation, so that distal edges 215 of tri-layer actuators 10 can move between first shapes (where they are contained within concavity 219) and second shapes (where they project out of concavity 219). Frame 213 is shown in FIG. 5B and comprises triangular cross-section grooves 232, the tilted face 234 of each groove 232 may be covered with or otherwise comprise a conductor which may serve as one of the electrodes for tri-layer actuators 10 (e.g. an electrode for first conductive layer 12). Sheets 230 comprising tri-layer actuators 10 may then placed into grooves 232, such that tri-layer actuators 10 lay on corresponding tilted faces 234 of grooves 232. Although not shown, the electrodes can be patterned into strips (as shown in FIG. 3) in correspondence with each of distal edges 215 of tri-layer actuators 10, so that each individual distal edge 215 can be independently controlled to provide an array of tri-layer actuators 10.

A cap 236 (shown in FIG. 5C) may be shaped to provide projections 238 and projections 238 may be shaped to be complementary to, and extend into, grooves 232. Cap 236 may comprise an apertured cover member 240 having apertures 242. Apertures 242 may be shaped and located so that distal edges 215 of tri-layer actuators 10 can move through apertures 242. In the illustrated embodiment, there is a one to one correspondence between apertures 242 and tri-layer actuators 10, although this is not necessary and there may be different numbers of apertures 242 than the number of tri-layer actuators 10. In some embodiments, there are a plurality of tri-layer actuators 10 for each of one or more apertures 242. Second electrodes 244 may be provided on the surfaces of projections 238 of cap 236 to provide the second electrodes 244 for tri-layer actuators 10 (e.g. electrodes for second conductive layer 14). The structure may then be assembled by placing sheets 230 (FIG. 5A) into grooves 232 and against faces 234 of frame 213 (FIG. 5B) and then placing cap 236 (FIG. 5C) onto frame 213 such that projections 238 extend into grooves 232.

FIGS. 6A and 6B (collectively, FIG. 6) depict cross-sectional views of a portion (e.g. a cell) 328 of an apparatus 322 which may be used to provide human-detectable tactile stimulus according to another particular embodiment. The stimulus provided by portion 328 of apparatus 322 (which may be referred to herein as apparatus 322 for brevity) may be oriented (at least in part) in transverse directions indicated (in the FIG. 6 embodiment) by double-headed arrow 326. Such transverse directions may be directions that are parallel to or tangential to a substrate 325 of apparatus 322 or parallel to or tangential to the general (e.g. macroscopic) surface where users interact with apparatus 322. As will be explained in more detail below, tri-layer actuators 10 of apparatus 322 are in contact with effectors 323 and deformation of tri-layer actuators 10 causes corresponding movement (e.g. deformation or otherwise) of effectors 323 and the movement or associated forces of effectors 323 can be detected by a human body surface 317 (e.g. a fingertip surface 317).

Apparatus 322 comprises one or more tri-layer actuators 10 which may be similar to tri-layer actuators 10 of FIG. 1 described above. Tri-layer actuators 10 are shown schematically in FIG. 6. Tri-layer actuators 10 of apparatus 322 are in contact (e.g. constant contact) with effectors 323. In the illustrated embodiment of FIG. 6, tri-layer actuators 10 extend away from a substrate 325 (to which they are connected either rigidly or deformably) and effectors 323 comprise elastically deformable material which is located between transversely adjacent pairs of tri-layer actuators 10. In the illustrated embodiment of FIG. 6, effectors 323 fill the cross-sectional region between pairs of adjacent tri-layer actuators 10, although this is not necessary. In the illustrated embodiment of FIG. 6, each effector 323 contacts a pair of adjacent tri-layer actuators 10, although this again is not necessary.

FIG. 6A shows tri-layer actuators 10 having first shapes which correspond to the application of corresponding first voltages. In some embodiments, these first shapes of tri-layer actuators 10 correspond to their ambient states (i.e. a zero voltage applied between conductive layers 12, 14 of tri-layer actuators 10), although this is not necessary and the first shapes of tri-layer actuators 10 may generally be associated with any corresponding applied first voltage. In the case of the illustrated embodiment of FIG. 6A, the first shape of tri-layer actuators 10 (in their ambient states) is generally planar and extends away from substrate 325. When suitable second voltages are applied between conductive layers 12, 14 of tri-layer actuators 10, tri-layer actuators 10 may deform to have second shapes shown in FIG. 6B. In particular, in the case of the configuration illustrated in FIG. 6B, voltages having opposite polarities are applied to transversely adjacent tri-layer actuators 10. The result is that the second shapes of tri-layer actuators 10 result in pairs of transversely adjacent tri-layer actuators 10 either bending toward one another (as is the case for the tri-layer actuator pairs 10A, 10B; 10C, 10D; 10E, 10F) or bending away from one another (as is the case for the tri-layer actuator pairs 10B, 10C; 10D, 10E). When tri-layer actuators move between their first shapes (FIG. 6A) and their second shapes (FIG. 6B), contact between tri-layer actuators 10 and effectors 323 causes corresponding movement (e.g. deformation) of effectors 323.

For effectors 323 of the FIG. 6 embodiment, the movement of effectors 323 involves deformation of effectors 323. In particular, effectors 323 located between pairs of tri-layer actuators 10 that bend transversely toward one another are compressively deformed to have shapes 323B and effectors 323 located between pairs of tri-layer actuators 10 that bend away from one another are stretchably deformed (i.e. expansive deformation) to have shapes 323C. It can be seen from FIG. 6 that both the compressively deformed shapes 323B and stretchably deformed (i.e. expansive deformed) shapes 323C of effectors 323 shown in FIG. 6B are different from the ambient shapes 323A of effectors shown in FIG. 6A. Further, FIG. 6B shows that the compressively deformed shapes 323B of effectors 323 may result in a projection of at least a portion of compressively deformed effectors 323 away from substrate 325 in directions generally normal to substrate 325 (or having directional components normal to substrate 325) and that stretchably deformed shapes 323C of effectors 323 may result in an indentation of at least a portion of stretchably deformed effectors 323 toward substrate 325 in directions generally normal to substrate 325 (or having directional components normal to substrate 325). Such deformed shapes may also result in movement (e.g. deformation or otherwise) of effectors 323 in transverse directions 326. The movement of effectors 323 between their first shapes 323A (FIG. 6A) and their second shapes 323B, 323C (FIG. 6B) and/or corresponding switching between these configurations may be detectable by human skin surface 317. In some embodiments, the differences between shapes 323B, 323C of effectors 323 may be detectable by human skin surface 317. In some embodiments, the polarities of the voltages applied to tri-layer actuators 10 shown in FIG. 6B can be reversed, so that adjacent tri-layer actuators pairs 10B, 10C and 10D, 10E bend toward one another and adjacent tri-layer actuator pairs 10A, 10B; 10C, 10D; and 10E, 10F bend away from one another. The voltages applied to tri-layer actuators 10 may then be configured to switch between this reverse polarity configuration and the illustrated FIG. 6B configuration. The movement of effectors 323 between the reverse polarity configuration and the FIG. 6B configuration and/or corresponding switching between these configurations can be detected by human skin surface 317.

Figure 7C:
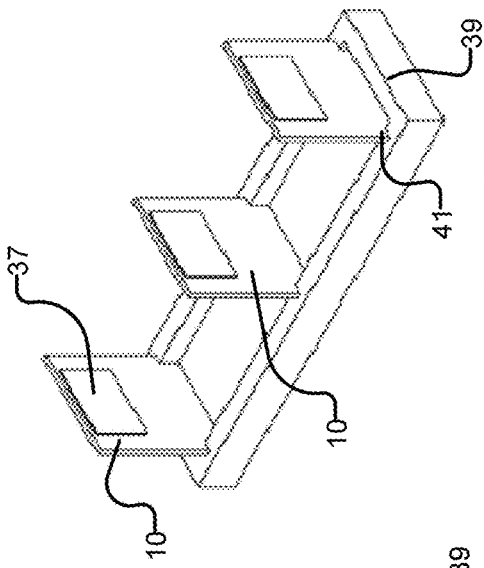
FIGS. 7A-7F (collectively, FIG. 7) schematically depict a method for fabricating the FIG. 6 apparatus according to an exemplary non-limiting embodiment.
Figure 7B:
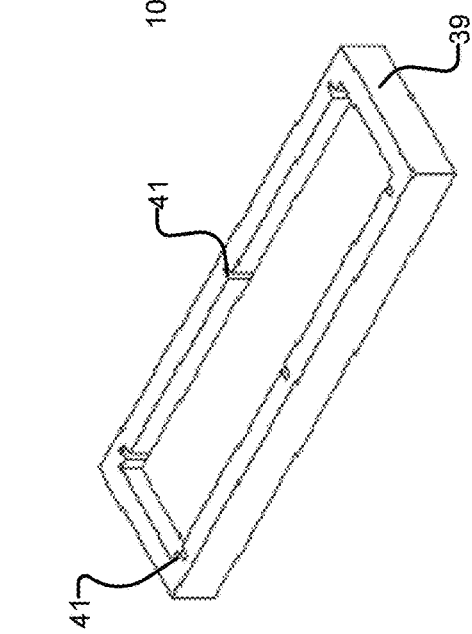
Figure 7A:
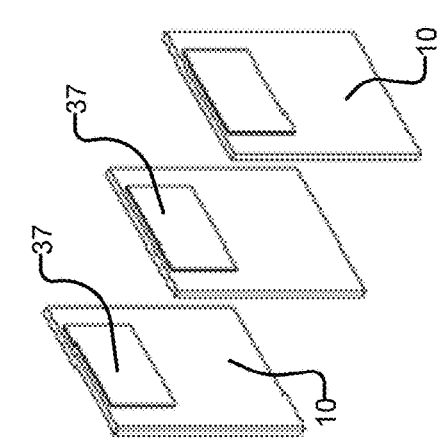
Figure 7F:
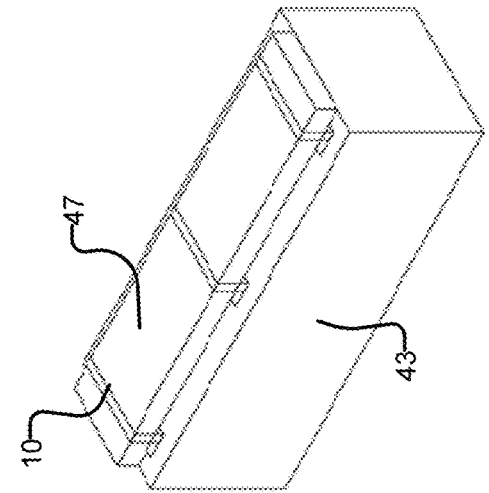
Figure 7E:
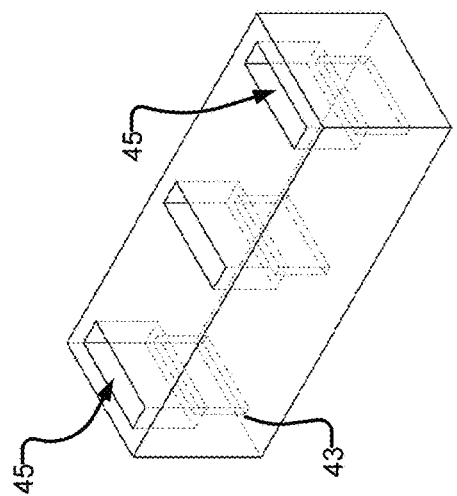
Figure 7D:
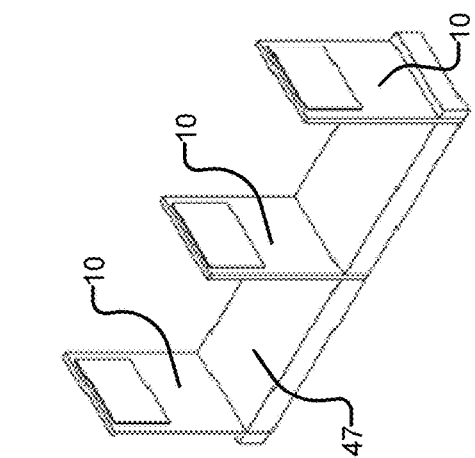

FIGS. 7A-7F (collectively, FIG. 7) schematically depict a method for fabricating the FIG. 6 apparatus 322 according to an exemplary non-limiting embodiment. Tri-layer actuators 10 may be fabricated using any of the methods described herein (e.g. the methods described in connection with FIGS. 3 and 5—with solid polymer electrolytes (SPE) deformable (ionic conducting) layers 16 and PEDOT conductive layers 12, 14 or using PVDF membranes electrodeposited on both sides with Polypyrrole). Tri-layer actuators 10 may be finely cut into rectangular shapes with suitable dimensions. Non-limiting exemplary dimensions which may be suitable are on the order of 5 mm²×8 mm². As shown in FIG. 7A, gold (or other suitable metallic) electrodes 37 may then be deposited on both sides of tri-layer actuators 10, using any suitable technique, such as using a shadow mask, for example. As shown in FIG. 7B, a mold 39 may be used to shape the elastomeric effectors 323. Mold 39 may first be coated with PVA as an underlayer. Then tri-layer actuators 10 may be aligned in suitably shaped grooves 41 of mold 39, as shown in FIG. 7C, so that electrodes 37 are located outside of grooves 41. Then an elastomer, e.g. an encapsulating material, such as, by way of non-limiting example, Styrene Iso-Butylene Styrene (SIBSTAR), may be poured or otherwise introduced into mold 39 around tri-layer actuators 10 to form a film over tri-layer actuators 10. In some embodiments, this encapsulating film may have a thickness in a range of 0.25 mm-2.5 mm. After the elastomer is cured, the thin layer of elastomer embedding a part of tri-layer actuators 10 will be peeled off or otherwise removed from mold 39 by dissolving the PVA layer into water and then the edges may be cut as shown in FIG. 7D to provide a number of tri-layer actuators 10 partially embedded in elastomer 47. A holder 43 through which wells 45 with suitable for receiving tri-layer actuators 10 are cut, is made as shown in FIG. 7E. A portion of each well 45 may be shaped to hold the region of each tri-layer actuator 10 having electrode 37 while another portion of each well 45 may be shaped to allow its tri-layer actuator 10 to move freely in well 45. The tri-layer actuators 10 partially embedded into elastomer 47 may then be inserted into holder 43 so that elastomer 47 sits on top of holder 43 and holder 43 provides a substrate 325 as shown in FIG. 7F.

FIGS. 8A-8D (collectively, FIG. 8) depict a variety of views of a portion (e.g. a cell) 428 of an apparatus 422 which may be used to provide human-detectable tactile stimulus according to another particular embodiment. The stimulus provided by portion 428 of apparatus 422 (which may be referred to herein as apparatus 422 for brevity) may be oriented (at least in part) in transverse directions indicated (in the FIG. 8 embodiment) by double-headed arrow 430. Such transverse directions may be directions that are parallel to or tangential to a substrate 425 of apparatus 422 or parallel to or tangential to the general (e.g. macroscopic) surface where users interact with apparatus 322. As will be explained in more detail below, like apparatus 322 of FIG. 6, tri-layer actuators 10 of apparatus 422 are in contact with effectors 423 and deformation of tri-layer actuators 10 causes corresponding movement of effectors 423, which can be detected by a human body surface 417 (e.g. a fingertip surface 417).

Apparatus 422 comprises one or more tri-layer actuators 10' which are similar to tri-layer actuators 10 of FIG. 1 described above. A cross-section of one tri-layer actuator 10' is shown schematically in FIG. 8B. Tri-layer actuator 10' differs from tri-layer actuator 10 described above in that tri-layer actuator 10' comprises a central deformable layer 16 which is shared by a first pair of conductive layers 12A, 14A and a second pair of conducting layers 12B, 14B. Voltages may be selectively applied to any of the conductive layers 12A, 14A, 12B, 14B. For example, a voltage may be applied between the first pair conductive layers 12A, 14A causing one of conductive layers 12A, 14A to contract and the other one of conductive layers 12A, 14A to expand, and thereby causing deformation of tri-layer actuator 10' leftward or rightward on the page in the illustrated view of FIG. 8B. As another example, a voltage may be applied between the second pair of conductive layers 12B, 14B causing one of conductive layers 12B, 14B to contract and the other one of conductive layers 12B, 14B to expand, and thereby causing deformation of tri-layer actuator 10' upward or downward on the page in the illustrated view of FIG. 8B. In the illustrated embodiment of FIG. 8, tri-layer actuators 10' extend away from a substrate 425 (to which they are connected either rigidly or deformably). As will be appreciated, suitable voltages can be applied to first pair of conductive layers 12A, 14A and/or second pair of conductive layers 12B, 14B to controllably deform tri-layer actuator 10' over a two-dimensional space and to effect corresponding movement of effector 423 of a two-dimensional space. For example, suitable voltages may be applied to first pair of conductive layers 12A, 14A and second pair of conductive layers 12B, 14B to controllably deform tri-layer actuator 10' in a 45° angle (instead of up-down or left-right, in the illustrated view of FIG. 8B). Further any number of conductive layers could be used around central deformable layer 16, depending on the desired direction/quantum of movement of actuator 10'. In some embodiments, multiple layers can be stacked to increase the corresponding force. When stacked tri-layer actuators are allowed to slide with respect to one another, the force associated with the movement of the tri-layer actuators can be increased without dramatically reducing the displacement.

In the FIG. 8 embodiment, tri-layer actuators 10' of apparatus 422 are in contact with effectors 423. Effectors 423 of the FIG. 8 embodiment comprises elongated hair-like structures which extend away from tri-layer actuators 10' and from substrate 425. Effectors 423 shown in FIG. 8 have generally circular cross-sections, but this is not necessary and, in some embodiments, effectors 423 may have different cross-sectional shapes or shapes where the cross-section varies (e.g. pyramidal shapes). In some embodiments, effectors 423 may comprise a contiguous extension of the deformable layer 16 of tri-layer actuators 10'. Effectors 423 are in contact with tri-layer actuators 10'. In the case of the FIG. 8 embodiment, there is a one-to-one correspondence between effectors 423 and tri-layer actuators 10', but this is not necessary. In some embodiments, there may be multiple tri-layer actuators 10' in contact with individual effectors 423 or multiple effectors 423 in contact with individual tri-layer actuators 10'.

FIG. 8C shows tri-layer actuators 10' in a first shape corresponding with a first applied voltage. In the illustrated embodiment, the first shape of tri-layer actuators 10' shown in FIG. 8C corresponds to their ambient states (i.e. a zero voltage applied between conductive layers 12A, 14A or between conductive layers 12B, 14B of tri-layer actuators 10'). When tri-layer actuators 10' have a first applied voltage, they have corresponding first shapes. In the case of the illustrated embodiment of FIG. 8C, the first shape of tri-layer actuators 10' (in their ambient states) extends in a direction that is generally normal (e.g. within ±5% of normal in some embodiments and within ±10% of normal in some embodiments) to substrate 425. FIG. 8D illustrates the configuration when second voltages are applied between conductive layers 12A, 14A of tri-layer actuators 10'. Under the application of second voltages shown in FIG. 8D, conductive layer 12A contracts and conductive layer 14A expands so that tri-layer actuators 10' have second shapes. In the particular case of the illustrated FIG. 8D embodiment, the shapes of tri-layer actuators 10' deform such that the ends of tri-layer actuators 10' that are distal from substrate 425 move in a transverse direction 430A which is generally tangential to the surface of substrate 425.

It will be appreciated that the second shapes of tri-layer actuators 10' shown in FIG. 8D represent only one possible voltage configuration (e.g. polarity) applied between conductive layers 12A, 14A. Inverting this applied voltage configuration (e.g. inverting the polarity) between conductive layers 12A, 14A will cause tri-layer actuators 10' to deform to have third shapes wherein their distal ends move in a transverse direction 430 opposite to that of direction 430A. Similarly, applying voltages with either polarity between conductive layers 12B, 14B will cause tri-layer actuators 10' to deform to have fourth and fifth shapes wherein their distal ends move in transverse directions which are tangential to the surface of substrate 425 but which are orthogonal to transverse directions 430. In this manner, it will be appreciated that suitable application of voltages between conductive layers 12A, 14A and/or between conductive layers 12B, 14B can be used to control the movement of tri-layer actuators 10' over two dimensions and/or corresponding movement of effectors 423 over two dimensions. It will be similarly appreciated that tri-layer actuators 10' are not limited to having two pairs of conductive layers 12A, 14A and 12B, 14B which are orthogonal to one another. Tri-layer actuators 10' may be fabricated with a single pair of conductive layers (to effect one-dimensional movement of tri-layer actuators 10 and/or corresponding one-dimensional movement of effectors 423), two pairs of non-parallel oriented conductive layers (to effect two-dimensional movement of tri-layer actuators 10 and/or corresponding two-dimensional movement of effectors 423) or more than two pairs of conductive layers (to effect more precisely controllable two-dimensional movement of tri-layer actuators 10 and/or corresponding two-dimensional movement of effectors 423). Also, various pairs of conductive layers may have angular relationships with one another that are other than orthogonal.

When tri-layer actuators 10' move between their first shapes (FIG. 8C) and their second shapes (FIG. 8D) or between any of their other shapes (as discussed above), contact between tri-layer actuators 10' and effectors 423 causes corresponding movement of effectors 423. In the illustrated embodiment of FIG. 8, the movement of effectors 423 is effected by the corresponding movement of tri-layer actuators 10' For example, as between the configurations of FIG. 8C (first applied voltages (which may be zero applied voltage)) and 8D (second voltages applied to conductive layers 12A, 14A), effectors 423 move in the same direction (direction 430A) as the distal ends of tri-layer actuators 10'. The movement of effectors 423 in response to application of other voltages to tri-layer actuators 10' may similarly be in directions corresponding to the directions of deformation of the distal ends of tri-layer actuators 10'. It will be appreciated that effectors 423 move (relative to the ambient configuration shown in FIG. 8C) in response to applied voltages of either polarity to conductive layers 12A, 14A and in response to applied voltages of either polarity to conductive layers 12B, 14B. The movement of effectors 423 between first shapes and/or configurations (shown in FIG. 8C, which may corresponding to their ambient shapes and/or configurations) and their second shapes and/or configurations under the application of any of these voltages may be detectable by human skin surface 417. Furthermore, movement of effectors 423 between their shapes and/or configurations under the application of different voltage configurations and/or application of voltages to different pairs of conductive layers (e.g. to conductive layers 12B, 14B versus to conductive layers 12A, 14A) may be detectable by human skin surface 417.

In some embodiments, the distal ends of effectors 423 may be provided with textures shapes (e.g. projections and/or indents of uniform or varying size to give more texture feeling possibilities. Effectors 423 may be fabricated from suitable material(s) and effectors 423 may be suitably sized to effect a tradeoff between providing sufficient stiffness for detection by human skin surface 417 on one hand and being able to deform along with tri-layer actuators 10' (or along with human skin surface 417). Effectors 423 need not be contiguous extensions of deformable layer and may be some other material or component which may be in contact with tri-layer actuators 10. In some embodiments, the material from which effectors 423 has a stiffness greater than that of tri-layer actuators 10. In some embodiments, spacing between effectors 423 may be in a range of 0.5 mm-6 mm. In some embodiments, this spacing is in a range of 1 mm-3 mm, which corresponds roughly to the minimum two-point discrimination of the human fingertip 417, Sides of each effector 423 can also be colored in some embodiments to provide visual stimulus (along with tactile stimulus) as it moves between configurations.

As with the other embodiments described herein, localized vibrations or texture patterns can be obtained with the FIG. 8 embodiment by selectively applying voltages to a particular tri-layer actuator 10' or one or more subsets of tri-layer actuators 10' to move their corresponding individual effectors 423. Such selective application of voltages may be effected by a suitable control circuit similar to control circuit 18 described above.

Figure 9C:
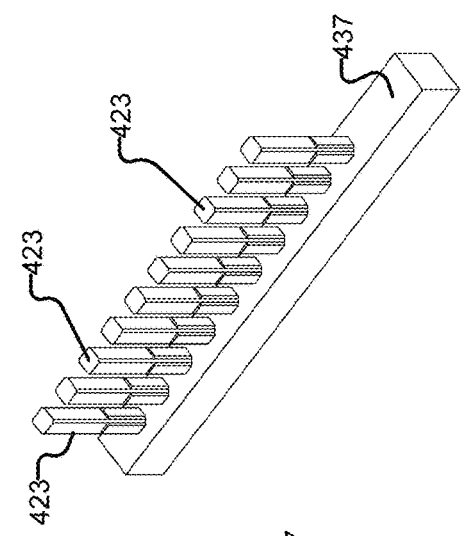
FIGS. 9A-9D (collectively, FIG. 9) schematically depict a method for fabricating the FIG. 8 apparatus according to an exemplary non-limiting embodiment.
Figure 9B:
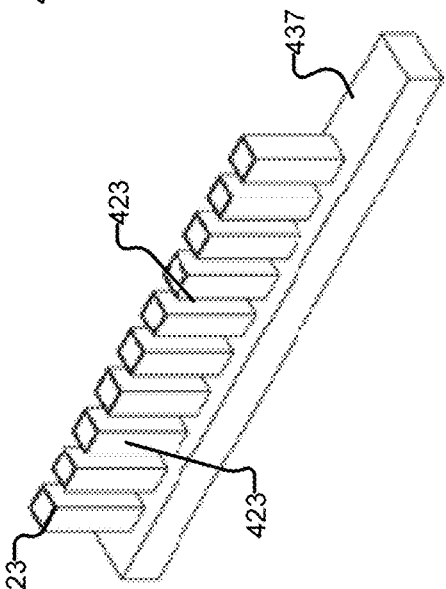
Figure 9D:
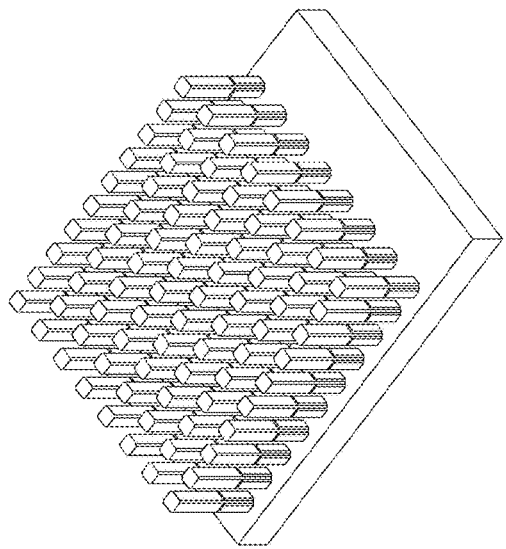
Figure 9A:
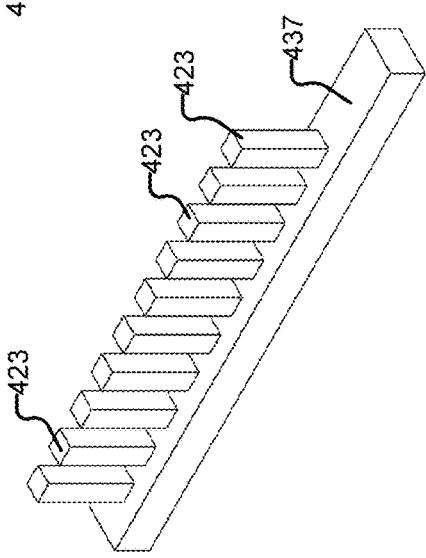

FIGS. 9A-9D (collectively, FIG. 9) schematically depict a method for fabricating the FIG. 8 apparatus 422 according to an exemplary non-limiting embodiment. Tri-layer actuators 10' may be fabricated using the method explained in detail in connection with FIG. 3. First, as shown in FIG. 9A, a solid polymer electrolyte is molded to form a 1-D array of hair-like effectors 423. In some embodiments, effectors 423 may be formed to have dimensions on the order of 1.5 mm×1.5 mm×5 mm. Then, effectors 423 may be immersed into PEDOT from a direction opposing holder 437 and then cured so that the upper and side surfaces (in the illustrated view) of effectors 423 and the upper surface (in the illustrated view) of holder 437 are coated with PEDOT as shown in FIG. 9B. Then, as shown in FIG. 9C, PEDOT may be removed from the top of each effector 423 and from thin stripes along the length of effectors 423 to provide electrically disconnected conduction layers 12A, 12B, 14A, 14B at four locations on effector 423. Individually fabricated one-dimensional arrays of effectors 423 may be combined to provide a two-dimensional array of effectors as shown in FIG. 9D.

Figure 13:
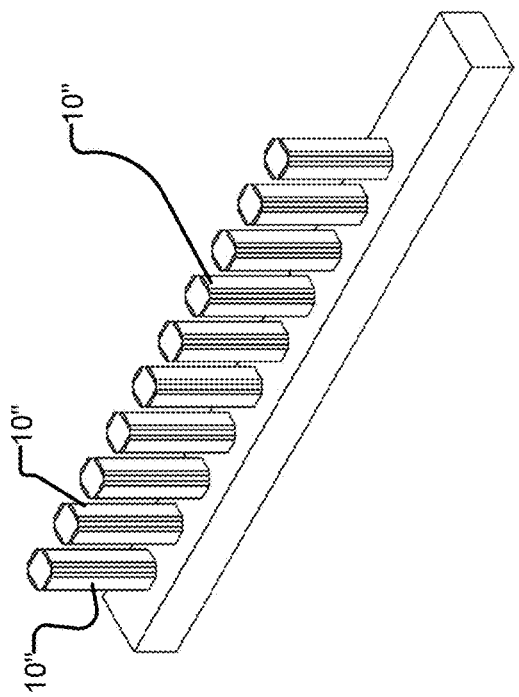
FIG. 13 is a schematic depiction of a plurality of tri-layer actuators which can be controlled (by application of suitable voltages) for movement over a two-dimensional space.

It is not necessary that two-dimensional control of tri-layer actuators 10' be limited to embodiments where tri-layer actuators 10' are in contact with effectors. FIG. 13 is a schematic depiction of a plurality of tri-layer actuators 10" which can be controlled (by application of suitable voltages) for movement over a two-dimensional space—e.g. in first and second opposed directions and in third and fourth opposed directions which are non-parallel to the first and second opposed directions (and which may thereby span a two-dimensional transversely oriented space). Tri-layer actuators 10" may be similar in many respects to tri-layer actuators 10' described above, and differ primarily in that first and second opposed conductive layers 12A, 14A and second and third opposed conductive layers 12B, 14B (see FIG. 8B) extend along the length of tri-layer actuators 10" and tri-layer actuators 10" are not in contact with effectors 423. In other respects, tri-layer actuators 10" may have characteristics similar to tri-layer actuators 10' and vice versa. It will be appreciated that application of suitable voltages between first and second opposed conductive layers 12A, 14A causes movement (e.g. deformation or otherwise) of tri-layer actuator 10" in corresponding first and second opposed directions and that application of suitable voltages between third and fourth opposed conductive layers 12B, 14B causes movement (e.g. deformation or otherwise) of tri-layer actuator 10" in corresponding third and fourth opposed directions which are non-parallel with the first and second opposed directions (and which may thereby span the two-dimensional space).

Figure 10:
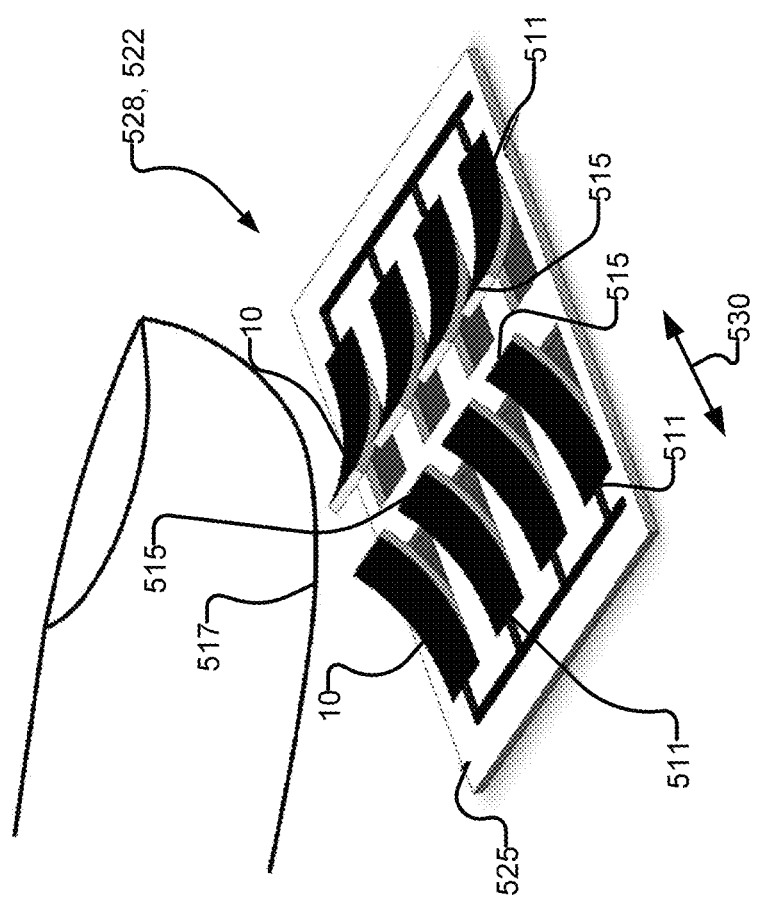
FIG. 10 depicts a portion (e.g. a cell) of an apparatus which may be used to provide human-detectable tactile stimulus according to another particular embodiment.

FIG. 10 depicts a portion (e.g. a cell) 528 of an apparatus 522 which may be used to provide human-detectable tactile stimulus according to another particular embodiment. The stimulus provided by portion 528 of apparatus 522 (which may be referred to herein as apparatus 522 for brevity) may be oriented (at least in part) in transverse directions indicated (in the FIG. 10 embodiment) by double-headed arrow 530. Such transverse directions may be directions that are parallel to or tangential to a substrate 525 of apparatus 522 or parallel to or tangential to the general (e.g. macroscopic) surface where users interact with apparatus 522. As will be explained in more detail below, like apparatus 222 of FIG. 4, tri-layer actuators 10 of apparatus 522 are cantilevered and have first edges 511 which are connected to a rigid frame 513 (e.g. to substrate 525) and have distal edges 515 which are free to move independently of one another relative to substrate 525.

Apparatus 522 differs from apparatus 222 of FIG. 4 primarily in that when first voltages are applied to tri-layer actuators 10 of apparatus 522 (which may correspond to the situation when tri-layer actuators 10 of apparatus 522 are in their ambient states (i.e. a zero voltage applied between conductive layers 12, 14 of tri-layer actuators 10), tri-layer actuators 10 may have first shapes where tri-layer actuators 10 lie generally in the plane of substrate 525. When suitable second voltages are applied between conductive layers 12, 14 of tri-layer actuators 10, tri-layer actuators 10 may deform to have second shapes where one of conductive layers 12, 14 is contracted and the other one of conductive layers 12, 14 is expanded to cause tri-layer actuators 10 to bend out of the plane of substrate 525 to have the shapes shown in FIG. 10. Like apparatus 222 of FIG. 4, when first voltages are applied to tri-layer actuators 10 of apparatus 522 (e.g. tri-layer actuators 10 are in their ambient states in the case of the FIG. 10 embodiment), distal edges 515 of tri-layer actuators 10 may have corresponding first linear distances from their first edges 511. When suitable second voltages are applied between conductive layers 12, 14 of tri-layer actuators 10, tri-layer actuators 10 of apparatus 522 may deform to have second shapes shown in FIG. 10, where distal edges 515 of tri-layer actuators 10 are at second linear distances (less than the first distances) from first edges 511 of tri-layer actuators 10. In particular, in the case of the illustrated embodiment of FIG. 10, for each tri-layer actuator 10, the second shape is relatively more curved (e.g. has a smaller radius of curvature) than the first shape and, consequently, second distances between its first edge 511 and its distal edge 515 is less than the first distance between its first edges 511 and its distal edge 515. In the case of the illustrated embodiment of FIG. 10, the first shape is generally planar (which has a notionally infinite radius of curvature), but this is not necessary. In some embodiments, the first and second shapes may both be curved and one of the first and second shapes may have a greater curvature (smaller radius of curvature), such that the linear distance between first edges 511 and distal edges 515 is relatively small for the shape with greater curvature and relatively large for the shape with less curvature. In the case of the FIG. 10 embodiment, the first shapes of tri-layer actuators 10 (corresponding to the application of first voltages (which may be zero applied voltages) may be tangential to substrate 525 and, upon application of the second voltages, the corresponding second shapes involve deformation of distal edges 515 of tri-layer actuators 10 away from substrate 525 in a direction which is normal to the tangent of substrate 525.

In the FIG. 10 embodiment, transverse edges (as well as distal edges 515) may be separated (e.g. cut apart from) substrate 525 to permit tri-layer actuators 10 to rise out the plane of substrate 525 as they actuate. In some embodiments, an elastomer separation layer such as polydimethylsiloxane (PDMS) can cover the surface of substrate 525 in inactive area and windows may be formed in the regions of tri-layer actuators 10 to create space between tri-layer actuators 10 and human skin surface 517. If this layer is thick enough, tri-layer actuators 10 may bend by 90°, creating transversely oriented force (e.g. in directions 530). In embodiments with thin or no separation layer, apparatus 522 may generate primarily force in direction normal to substrate 525. In some embodiments, features such as projections and indents may be attached to or formed on tri-layer actuators 10 to enhance the sense of touch and/or to create a new kind of feeling on skin surface 517 with different shapes of tri-layer actuators 10. Or, as is the case with the embodiment of FIG. 2, both transverse edges of tri-layer actuators 10 can be bound to substrate 525 so that a central portion of tri-layer actuators 10 raises above the surface and by a distance greater than the distances raised by the transverse edges of the tri-layer actuators 10

Figure 11A:
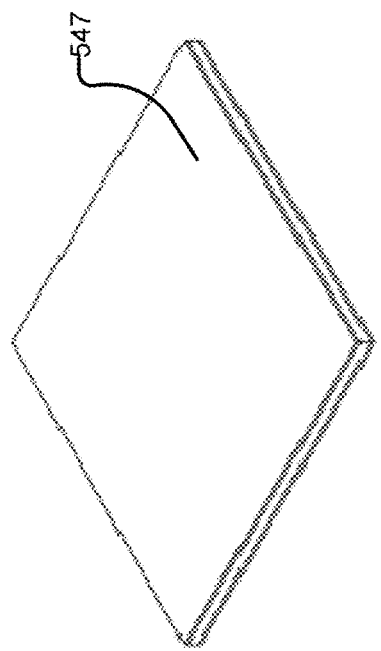
FIGS. 11A-11D (collectively, FIG. 11) schematically depict a method for fabricating the FIG. 10 apparatus according to an exemplary non-limiting embodiment.
Figure 11B:
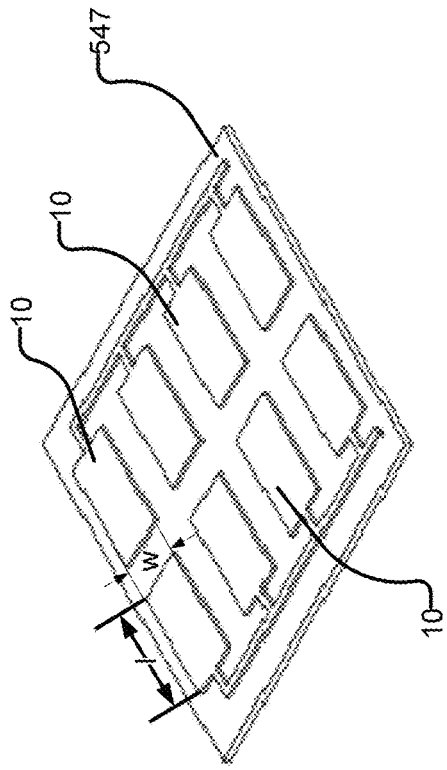
Figure 11C:
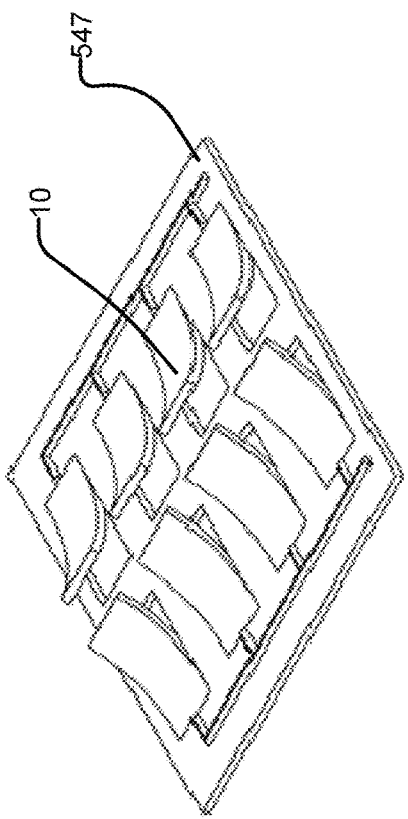
Figure 11D:
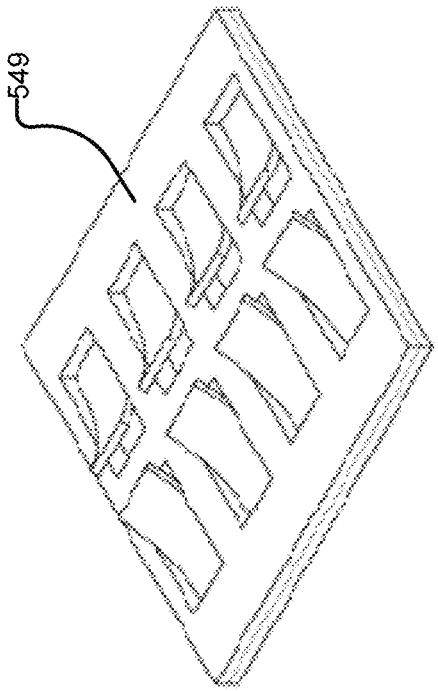

FIGS. 11A-11D (collectively, FIG. 11) schematically depict a method for fabricating the FIG. 10 apparatus 522 according to an exemplary non-limiting embodiment. A tri-layer actuator sheet 547 may be fabricated using either of the methods explained above (solid polymer electrolytes (SPE) as ionically conducting deformable layer 16 and PEDOT as conductive layers 12, 14 or using PVDF membranes electrodeposited on both sides with Polypyrrole). FIG. 11A shows this tri-layer actuator sheet 547. The conductive layers on both sides of sheet 547 may then be identically patterned using laser-micromachining as depicted in FIG. 11B to provide individual tri-layer actuators 10. The transverse width (w) of each tri-layer actuator 10 is between 0.5 mm-2 mm in some embodiments and the width/length (w/l) ratio is in arrange of 0.25-1 in some embodiments. The spacing in between two adjacent tri-layer actuators 10 may be in a range of 1-2 mm in some embodiments. A shown in FIG. 11C, three sides (the distal edges 515 and transverse edges) of the patterned tri-layer actuators 10 are then cut to permit out of plane actuation as described above. To provide a spacing between human skin surface 517 and the actuator plane, a sheet 549 of elastomer (PDMS, SIBSTAR, etc.) with rectangular windows with a pattern corresponding to the pattern of tri-layer actuators 10 is placed on top of sheet 547, as shown in FIG. 11D.

Figures 12A, 12B:
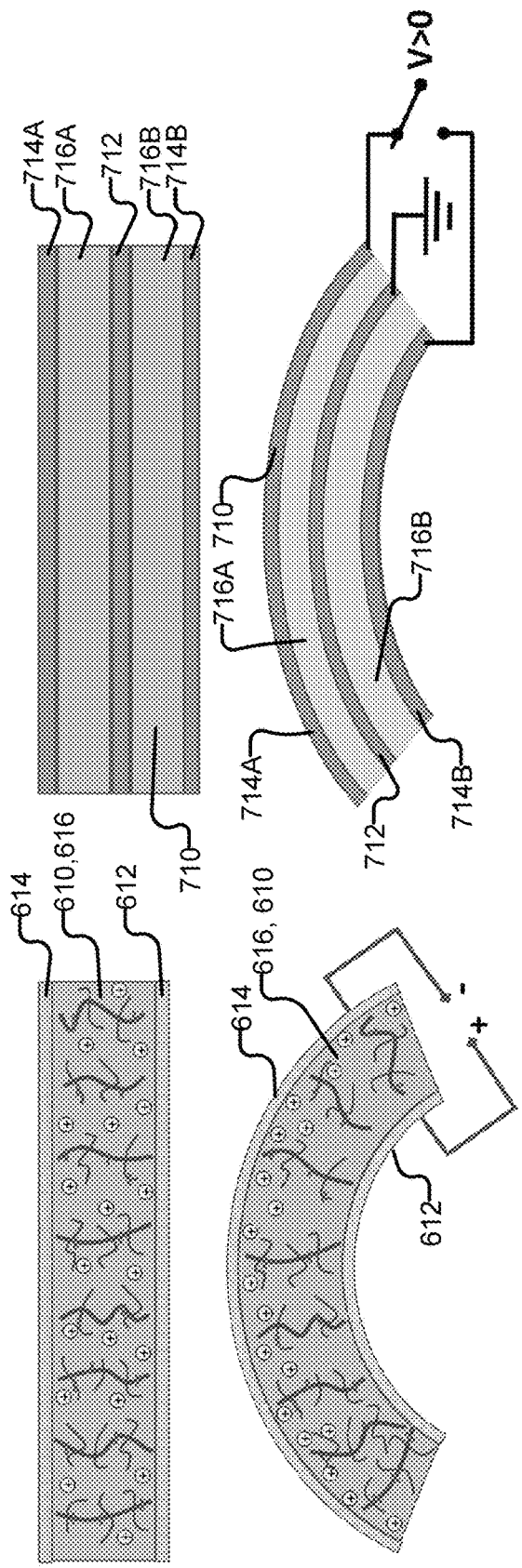
FIG. 12A schematically depicts an Ionic Polymer Metal Composite (IPMC) tri-layer actuator which may be used to provide the tri-layer actuator(s) in some embodiments.
FIG. 12B schematically depicts an actuator device comprising dielectric elastomers and electrostrictive materials in the form of two parallel capacitors which may replace the tri-layer actuator(s) in some embodiments.

As mentioned briefly above, currently preferred embodiments of comprise tri-layer actuators 10 wherein conductive layers 12, 14 are fabricated from conducting polymers. It should be noted that all of the above-described tactile stimulus apparatus can be fabricated using electroactive polymer (EAP) tri-layer actuators where conductive layers 12, 14 are fabricated from other materials, although operational characteristics of such tri-layer actuators may be different. For example, FIG. 12A shows an Ionic Polymer Metal Composite (IPMC) tri-layer actuator 610 which comprises metal conductive layers 612, 614 conductive layers and which, like conducting polymer tri-layer actuators 10, are planar and bend as voltage is applied between conductive layers 612, 614 because of ion transfer. In still other embodiments, tri-layer actuators of the apparatus described above may be replaced by dielectric elastomers and electrostrictive materials in the form of two parallel capacitors, as shown in FIG. 12B. In the illustrated embodiment of FIG. 12B, structure 710 comprises two layers of dielectric elastomer or electrostrictive material 716A, 716B sandwiched between three layers of electrodes 712, 714A, 714B. The middle electrode 712 may be grounded. By altering voltage between the electrodes 714A, 714B, the whole structure 710 can be caused to bend in opposing directions.

While a number of exemplary aspects and embodiments are discussed herein, those of skill in the art will recognize certain modifications, permutations, additions, and subcombinations thereof. For example:

Any embodiments, where tri-layer actuator(s) 10 are fabricated with conductive layers 12, 14 made from electrically conductive polymer, such tri-layer actuator(s) 10 may be made at least partially transparent to human-visible light wavelengths. By way of non-limiting example, conducting polymer layers 12, 14 fabricated from PEDOT with thicknesses on the order of 0.125 µm are expected to have transparencies of greater than 70% over the visible spectrum, with increasing transparency (e.g. over 80% in some embodiments and over 90% in some embodiments) with thinner conducting polymer layers 12, 14.

Any of the methods, apparatus and/or embodiments described herein may comprise one or more control circuits similar to control circuit 18 described above in connection with FIG. 1. Such control circuits may control the application of voltages to one or a plurality of tri-layer actuators 10. Such control circuits may be capable of controllably applying voltages to each individual tri-layer actuator within a group or plurality of tri-layer actuators and/or may control groups or pluralities of tri-layer actuators within a larger group or plurality of tri-layer actuators.

Any of the methods, apparatus and/or embodiments described herein having tri-layer actuators 10 with conducting polymer conductive layers 12, 14 may be caused to switch between tri-layer actuator shapes at frequencies and with switching response times similar to those described above in connection with tri-layer actuators 10 of the embodiments of FIGS. 1 and 2. As such, control circuits similar to control circuit 18 my generate complex waveforms (not merely sine wave or square wave waveforms) to generate correspondingly complex vibrational modes.

Effectors 423 similar to those of the embodiments of FIGS. 8 and 9 can be used with other embodiments described herein. For example, the distal edges 215 (or other portions) of the tri-layer actuators 10 used in the embodiments of FIGS. 4 and 5 may be constructed to contact effectors similar to effectors 423 and movement of such tri-layer actuators 10 may cause corresponding movement of such effectors in a manner which is human-detectable. As another example, the distal edges 515 (or other portions) of the tri-layer actuators 10 used in the embodiments of FIGS. 10 and 11 may be constructed to contact effectors similar to effectors 423 and movement of such tri-layer actuators 10 may cause corresponding movement of such effectors in a manner which is human-detectable.

Figure 14:
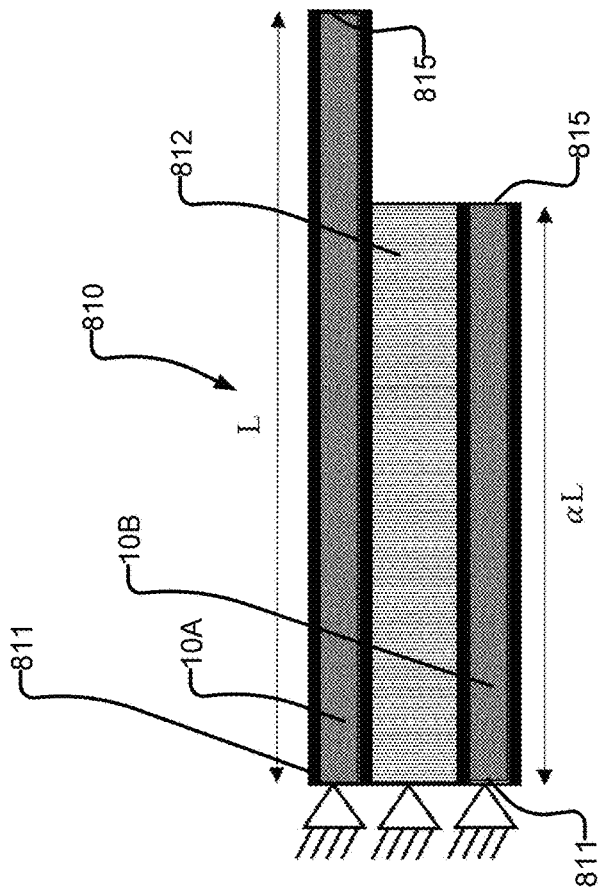
FIG. 14 schematically illustrates an apparatus for providing human-detectable stimulus comprising stacking configuration of a plurality of tri-layer actuators according to a particular embodiment.

In some embodiments, stacks of adjacent tri-layer actuators 10 may be used to increase force without dramatically reducing displacement. Such stacks of tri-layer actuators 10 may share components. For example, a conductive layer may be part of more than one tri-layer actuator. For example in the embodiments of FIGS. 2, 4 and 10, placing tri-layer actuators 10 close to one another such that they are in physical contact with, but can slide with respect to, each other, leads to increased force, while maintaining much of the displacement. This approach may be used to increase force to make the movement of the tri-layer actuators 10 more readily detectable. FIG. 14 schematically illustrates an apparatus 810 for providing human-detectable stimulus comprising stacking configuration of tri-layer actuators 10A and 10B according to a particular embodiment. Apparatus 810 comprises a layer of deformable material 812 located between tri-layer actuators 10A, 10B.

Deformable layer 812 may be electrically and ionically insulating. The inventors have observed (from experimentation) that when tri-layer actuators 10A, 10B are bonded to deformable material 812 and a suitable voltage is applied to the pair of tri-layer actuators 10A, 10B, the corresponding force output of apparatus 810 (e.g. as a whole) may be greater than the corresponding force output of a single tri-layer actuator. However, when tri-layer actuators 10A, 10B are bonded to deformable material 812, the displacement of apparatus 810 (e.g. as a whole) tends to decrease. In contrast, the inventors have observed (from experimentation) that when deformable material 812 is interposed between tri-layer actuators 10A, 10B, but tri-layer actuators 10A, 10B are permitted to slide relative to deformable material 812 and/or relative to the other one of tri-layer actuators 10A, 10B, then the corresponding force output of apparatus 810 (e.g. as a whole) may be greater than the corresponding force output of a single tri-layer actuator, but the sacrifice in displacement of apparatus 810 (e.g. as a whole) is reduced (the reduction in displacement of apparatus 810 is not as great) relative to when tri-layer actuators 10A, 10B are bonded to deformable material 812. In some embodiments, tri-layer actuators 10A, 10B can be bonded to deformable material 812 in first portions at or near one end (e.g. first ends 811) and may be permitted to slide relative to deformable material 812 in distal portions at or near another end (e.g. distal ends 815). In some embodiments, as is the case in the illustrated embodiment of FIG. 14, tri-layer actuators 10A, 10B may have different sizes. In some embodiments, force generation is improved (relative to having two tri-layer actuators 10A, 10B of the same size), when tri-layer actuator 10A has a dimension that is a different size than the corresponding dimension (i.e. a dimension in a parallel direction that is different than the direction between the two tri-layer actuators 10A, 10B) of tri-layer actuator 10B. In some embodiments, tri-layer actuator 10A has a dimension that is greater than 1.5 times the corresponding dimension of tri-layer actuator 10B. In some embodiments, tri-layer actuator 10A has a dimension that is greater than 1.8 times the corresponding dimension of tri-layer actuator 10B. It will be appreciated by those skilled in the art, that the FIG. 14 embodiment shows only a pair of stacked tri-layer actuators 10A, 10b. In some embodiments, more than two tri-layer actuators may be stacked in a similar manner.

In some embodiments, the tactile-stimulus providing embodiments described herein may be used in or on mobile electronic devices such as phones, notebook computers, tablets and/or the like to provide the user with tactile stimulus including tactile feedback.

In some embodiments, the tactile-stimulus providing embodiments described herein may be used in surfaces in which humans are, or can be, in contact, such as refrigerator doors, tables, cupboards, chairs, windows, doors, door handles walls, faucets, stoves, microwaves, dishwashers, washers, driers, banisters and/or the like.

In some embodiments, the tactile-stimulus providing embodiments described herein may be used in wearable bands, patches or clothing to provide stimulus directly to the underlying skin and or to fingers in contact with the devices. The tactile information may provide alerts (e.g. drug patch needs to be replaced, battery is low, blood sugar is low, phone call or message waiting and so on). In some embodiments, the tactile information may provide a pattern that can be recognized.

In some embodiments, the tactile-stimulus providing embodiments described herein may be used to create a pattern for the finger of on the skin that helps communication with the blind.

In some embodiments, the tactile-stimulus providing apparatus and methods described herein can additionally or alternatively act as sensors and/or transducers, wherein applied forces (e.g. forces applied by human users) result in deformation of tri-layer actuators 10 which cause corresponding electronic responses (e.g. voltage and/or current) in tri-layer actuators 10 (e.g. between conductive layers 12, 14). In such configurations, tri-layer actuators 10 may be additionally or alternatively configured to provide sensors and/or transducers which convert applied forces (and corresponding deformation of tri-layer actuator shapes) to corresponding electronic responses. In some embodiments, the same tri-layer actuators 10 may be configured to act as actuators and transducers. In some embodiments, different tri-layer actuators 10 within a single device can be used as actuators and as transducers.

In some embodiments, the tactile-stimulus providing embodiments described herein may be used to provide tactile feedback, which may be feedback to tactile input and/or to other inputs. For example, in response to the sensing of touch in a device, a local vibration can be generated using the tactile-stimulus providing embodiments described herein to indicate that the touch has been detected. This might be of use on a keypad or keyboard for example.

In some embodiments, the tactile-stimulus providing embodiments described herein may be used to provide tactile feedback in wearable devices that provide cues to guide human movement. For example this can be useful in the process of learning new physical tasks.

In some embodiments, the tactile-stimulus providing embodiments described herein may be used to provide tactile stimulus in new devices that are stretchable and/or conformable to a surface such as skin, fabric, leather, or hard curved surfaces.

In the embodiments of FIGS. 8, 9 and 13, where tri-layer actuators can be moved over two-dimensional regions, the description above suggests that voltages are applied between opposing conductive layers—e.g. between opposing conductive layers 12A, 14A and/or between opposing conductive layers 12B, 14B. This is not necessary. In some embodiments, it may be desirable to apply voltages between different pairs of conductive layers. For example, it may be desirable to apply voltages between conductive layer 12A and conductive layer 12B and/or between other combinations of conductive layers.

In some embodiments, tri-layer actuators may be stacked to provide multi-layer actuators having more than three layers. Some layers may be shared between tri-layer actuators 10. For example, in some embodiments, a conductive layer may be shared between adjacent tri-layer actuators 10. Unless the context dictates otherwise, in this description and any accompanying claims and/or aspects, references to tri-layer actuators should be understood to include the possibility that such tri-layer actuators can comprise part of multi-layer actuators comprising three or more layers where the three or more layers comprise a pair of conductive layers separated by a deformable layer that is ionically conductive and electronically non-conductive.

A number of design parameters are discussed above in relation to apparatus 122 of the FIG. 2 embodiment. Any of the other apparatus described herein may be designed with the same or suitably similar design parameters.

What is claimed is:

1. An apparatus for providing tactile stimulus to a human user, the apparatus comprising:
a plurality of tri-layer actuators arranged along a surface and spaced apart from one another in a transverse direction, the transverse direction generally tangential to the surface;
each tri-layer actuator comprising:
first and second conductive layers, the first and second conductive layers electronically and ionically conductive, the first and second conductive layers having one or more dimensions which vary in dependence on insertion of ions therein and withdrawal of ions therefrom;
a deformable layer located between and in contact with the first and second conductive layers to physically separate the first and second conductive layers from one another, the deformable layer electronically insulating and ionically conductive; and
each pair of transversely adjacent tri-layer actuators connected at their transversely adjacent edges to a deformable member
wherein, for each tri-layer actuator:
application of first and second voltages between the first and second conductive layers creates corresponding first and second distributions of ions within the first and second conductive layers and changing between application of the first and second voltages causes corresponding deformation of the tri-layer actuator between corresponding first and second shapes;
wherein the first shape of the tri-layer actuator is generally aligned with the surface and the second shape of the tri-layer actuator comprises a movement, relative to the first shape of the tri-layer actuator, of the first and second conductive layers away from the surface.

2. An apparatus according to claim 1 wherein the first and second conductive layers are fabricated from one or more electronically and ionically conducting polymers.

3. An apparatus according to claim 1 wherein the control circuit is configured to switch between application of the first and second voltages and the tri-layer actuator switches between the corresponding first and second shapes at frequencies greater than 100 Hz.

4. An apparatus according to claim 1 wherein the control circuit is configured to switch from application of the first voltage to application of the second voltage and each tri-layer actuator switches from the first shape to the second shape in a time less than 10 ms.

5. An apparatus according to claim 1 wherein the control circuit is configured to apply a periodic voltage signal between the first and second conductive layers, the periodic voltage signal having a frequency of greater than 100 Hz and the first and second voltages corresponding to minimum and maximum amplitudes of the periodic voltage signal.

6. An apparatus according to claim 1 wherein, for each switch between the first and second voltages, the difference between the first and second shapes is at least 63% of a maximum difference between steady state shapes of each tri-layer actuator corresponding to low frequency or DC application of the first and second voltages.

7. An apparatus according to claim 3 wherein for each switch between the first and second voltages, each tri-layer actuator switches between the first and second shapes with a switching time that is faster than that of an exponential ($e^{-t/\tau}$) having a time constant $\tau=2$ ms.

8. An apparatus according to claim 1 wherein:
in the first shape, each tri-layer actuator is substantially planar; and,
in the second shape, a dimension of the first conductive layer is extended relative to the dimension of the first conductive layer in the first shape and a dimension of the second conductive layer is contracted relative to the dimension of the second conductive layer in the first shape, so that, in the second shape, each tri-layer actuator is deformed out of the plane of the first shape.

9. An apparatus according to claim 1 wherein the difference or transition between the first and second shapes is detectable by the sense of touch of the mechanoreceptors of one or more of the human user's fingers.

10. An apparatus according to claim 9 wherein the difference or transition between the first and second shapes is detectable by the sense of touch of pacinian corpuscles in one or more of the human user's fingers.

11. An apparatus according to claim 1 wherein at least one of the plurality of tri-layer actuators is in contact with an effector when the at least one of the plurality of tri-layer actuators is in at least one of the first and second shapes and wherein the deformation of the at least one of the plurality of tri-layer actuators between the first and second shapes causes corresponding movement of the effector which movement of the effector is detectable by the sense of touch of the human user.

12. An apparatus according to claim 11 wherein the corresponding movement of the effector is in one or more transverse directions.

13. An apparatus according to claim 1 wherein at least one of first and second opposed transverse edges of at least one of the plurality of tri-layer actuators is attached to a deformable member.

14. An apparatus according to claim 13 wherein the first and second opposed transverse edges are both attached to deformable members.

15. An apparatus according to claim 1 wherein the plurality of tri-layer actuators are spaced apart from one another to provide a tactile perceptual frequency less than 100 Hz, where the human user contacts the apparatus with a body part and moves the body part across the apparatus at a speed of 10 mm/s.

16. An apparatus according to claim 1 wherein a dimension of each tri-layer actuator in a direction which the tri-layer actuators are spaced apart from one another is greater than 50 μm.

17. An apparatus according to claim 3 wherein a transverse dimension $d_s$ of each tri-layer actuator is less than 200 μm.

18. An apparatus according claim 1 wherein the control circuit is configured to switch between application of the first and second voltages and the tri-layer actuator switches between the corresponding first and second shapes at frequencies less than 100 Hz and wherein a transverse dimension $d_s$ of each tri-layer actuator is greater than 50 μm.

19. An apparatus according to claim 1 wherein the tri-layer actuator is dimensioned to provide a stiffness of the tri-layer actuator that is greater than a stiffness of the skin of the human user's fingertip.

20. An apparatus according to claim 1 wherein, for the second shape of each tri-layer actuator, the movement, relative to the first shape of each tri-layer actuator, of the first and second conductive layers away from the surface comprises a deformation of at least a first portion of the first and second conductive layers away from the surface in a first direction, the first direction normal to the surface.

21. An apparatus according claim 20 wherein application of a third voltage between the first and second conductive layers, the third voltage having an opposite polarity to the second voltage, creates a corresponding third distribution of ions within the first and second conductive layers and causes the corresponding tri-layer actuator to take on a third shape, wherein at least a second portion of the first and second conductive layers are deformed away from the surface in a second direction, the second direction opposed to the first direction.

22. An apparatus according to claim 1 wherein each tri-layer actuator comprises a central portion and first and second transverse portions located on corresponding first and second transverse sides of the central portion and wherein, for the second shape of each tri-layer actuator, the movement, relative to the first shape of the tri-layer actuator, of the first and second conductive layers away from the surface comprises a movement of the central portion away from the surface by a distance which is relatively large compared to first and second movements of the first and second transverse portions away from the surface.

23. An apparatus according to claim 14 wherein, for the second shape of the tri-layer actuator, the movement, relative to the first shape of the tri-layer actuator, of the first and second conductive layers away from the surface causes corresponding deformation of the deformable members at each of the transverse edges of the tri-layer actuator.

24. An apparatus according to claim 14 wherein the deformable members at each of the transverse edges of the tri-layer actuator comprise contiguous extensions of the deformable layer in transverse directions beyond the transverse edges of the first and second conductive layers.

25. A method for providing tactile stimulus to a human user, the method comprising:
providing a plurality of tri-layer actuators arranged along a surface and spaced apart from one another in a transverse direction, the transverse direction generally tangential to surface, each tri-layer actuator comprising:
first and second conductive layers, the first and second conductive layers electronically and ionically conductive, the first and second conductive layers having one or more dimensions which vary in dependence on insertion of ions therein and withdrawal of ions therefrom;
a deformable layer located between and in contact with the first and second conductive layers to physically separate the first and second conductive layers from one another, the deformable layer electronically insulating and ionically conductive; and
connecting a control circuit to the plurality of tri-layer actuators, the control circuit configurable, for each tri-layer actuator, to apply first and second voltages between the first and second conductive layers, thereby creating corresponding first and second distributions of ions within the first and second conductive layers and a change between application of the first and second voltages causing corresponding deformation of the tri-layer actuator between corresponding first and second shapes, wherein the first shape of the tri-layer actuator is generally aligned with the surface and the second shape of the tri-layer actuator comprises a movement, relative to the first shape of the tri-layer actuator, of the first and second conductive layers away from the surface.

26. A method according to claim 25 comprising fabricating the first and second conductive layers from one or more electronically and ionically conducting polymers.

27. A method according to claim 25 comprising switching between application of the first and second voltages and switching the tri-layer actuator between the corresponding first and second shapes at frequencies greater than 100 Hz.

28. A method according to claim 25 comprising switching from application of the first voltage to application of the second voltage and switching each tri-layer actuator from the first shape to the second shape in a time less than 10 ms.

29. A method according to claim 25 comprising applying a periodic voltage signal between the first and second conductive layers, the periodic voltage signal having a frequency of greater than 100 Hz and the first and second voltages corresponding to minimum and maximum amplitudes of the periodic voltage signal.

30. A method according to claim 27 wherein, for each switch between the first and second voltages, the difference between the first and second shapes is at least 63% of a maximum difference between steady state shapes of each tri-layer actuator corresponding to low frequency or DC application of the first and second voltages.

31. A method according to claim 27 comprising, for each switch between the first and second voltages, switching each tri-layer actuator between the first and second shapes with a switching time that is faster than that of an exponential ($e^{-t/\tau}$) having a time constant $\tau=2$ ms.

32. A method according to claim 25 wherein, in the first shape, each tri-layer actuator is substantially planar; and the method comprises, for the second shape, extending a dimension of the first conductive layer relative to the dimension of the first conductive layer in the first shape and contracting a dimension of the second conductive layer relative to the dimension of the second conductive layer in the first shape, so that, in the second shape, each tri-layer actuator is deformed out of the plane of the first shape.

33. A method according to claim 25 comprising detecting the difference or transition between the first and second shapes by the sense of touch of the mechanoreceptors of one or more of the human user's fingers.

34. A method according to claim 33 comprising detecting the difference or transition between the first and second shapes by the sense of touch of pacinian corpuscles in one or more of the human user's fingers.

35. A method according to claim 25 comprising fabricating at least one of the plurality of tri-layer actuators in contact with an effector when the at least one of the plurality of tri-layer actuators is in at least one of the first and second shapes and wherein the deformation of the at least one of the plurality of tri-layer actuators between the first and second shapes causes corresponding movement of the effector which movement of the effector is detectable by the sense of touch of the human user.

36. A method according to claim 35 wherein the corresponding movement of the effector is in one or more transverse directions, the transverse directions oriented tangentially to a substrate of the apparatus.

37. A method according to claim 25 comprising attaching at least one of first and second opposed transverse edges of at least one of the plurality of tri-layer actuators to a deformable member.

38. A method according to claim 37 comprising attaching both the first and second opposed transverse edges to deformable members.

39. A method according to claim 35 comprising spacing the plurality of tri-layer actuators apart from one another to provide a tactile perceptual frequency less than 100 Hz, where the human user contacts the apparatus with a body part and moves the body part across the apparatus at a speed of 10 mm/s.

40. A method according to claim 25 wherein a dimension of each tri-layer actuator in a direction which the tri-layer actuators are spaced apart from one another is greater than 50 µm.

41. A method according to claim 28 wherein a transverse dimension $d_5$ of each tri-layer actuator is less than 200 µm.

42. A method according claim 25 comprising switching between application of the first and second voltages and switching the tri-layer actuator between the corresponding first and second shapes at frequencies less than 100 Hz and wherein a transverse dimension $d_5$ of each tri-layer actuator is greater than 50 µm.

43. A method according to claim 25 comprising dimensioning the tri-layer actuator to provide a stiffness of the tri-layer actuator that is greater than a stiffness of the skin of the human user's fingertip.

44. A method according to claim 25 wherein, for the second shape of each tri-layer actuator, the movement, relative to the first shape of each tri-layer actuator, of the first and second conductive layers away from the surface comprises deforming of at least a first portion of first and second conductive layers away from the surface in a first direction, the first direction normal to the surface.

45. A method according claim 44 comprising applying a third voltage between the first and second conductive layers, the third voltage having an opposite polarity to the second voltage, creating a corresponding third distribution of ions within the first and second conductive layers and causing the corresponding tri-layer actuator to take on a third shape, wherein at least a second portion of the first and second conductive layers are deformed away from the surface in a second direction, the second direction opposed to the first direction.

46. A method according to claim 25 wherein each tri-layer actuator comprises a central portion and first and second transverse portions located on corresponding first and second transverse sides of the central portion and wherein, for the second shape of each tri-layer actuator, the movement, relative to the first shape of the tri-layer actuator, of the first and second conductive layers away from the surface comprises moving the central portion away from the surface by a distance which is relatively large compared to first and second movements of the first and second transverse portions away from the surface.

47. A method according to claim 38 wherein, for the second shape of the tri-layer actuator, the movement, relative to the first shape of the tri-layer actuator, of the first and second conductive layers away from the surface causes corresponding deformation of the deformable members at each of the transverse edges of the tri-layer actuator.

48. A method according to claim 38 comprising fabricating the deformable members at each of the transverse edges of the tri-layer actuator as contiguous extensions of the deformable layer in transverse directions beyond the transverse edges of the first and second conductive layers.

* * * * *